US010250899B1

(12) United States Patent
Hsieh et al.

(10) Patent No.: US 10,250,899 B1
(45) Date of Patent: Apr. 2, 2019

(54) STORING AND RETRIEVING HIGH BIT DEPTH IMAGE DATA

(71) Applicant: QUALCOMM Incorporated, San Diego, CA (US)

(72) Inventors: Cheng-Teh Hsieh, Del Mar, CA (US); In Suk Chong, San Diego, CA (US); Xianglin Wang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 25 days.

(21) Appl. No.: 15/713,065

(22) Filed: Sep. 22, 2017

(51) Int. Cl.
*H04N 19/46* (2014.01)
*H04N 19/159* (2014.01)
*H04N 19/645* (2014.01)
*H04N 19/70* (2014.01)
*H03M 13/00* (2006.01)

(52) U.S. Cl.
CPC ........... *H04N 19/46* (2014.11); *H04N 19/159* (2014.11); *H04N 19/645* (2014.11); *H04N 19/70* (2014.11); *H03M 13/6318* (2013.01)

(58) Field of Classification Search
CPC .... H04N 19/46; H04N 19/159; H04N 19/645; H04N 19/70; H03M 13/6318
See application file for complete search history.

(56) References Cited

U.S. PATENT DOCUMENTS

| | | | |
|---|---|---|---|
| 8,340,448 B2 | 12/2012 | Li et al. | |
| 8,410,959 B2 | 4/2013 | Karczewicz et al. | |
| 8,908,760 B2 | 12/2014 | Jeon et al. | |
| 8,989,275 B2 | 3/2015 | Teng et al. | |
| 9,398,303 B2 | 7/2016 | Lim et al. | |
| 2012/0114045 A1* | 5/2012 | Teng ................. | H04N 7/50 375/240.24 |
| 2013/0010864 A1* | 1/2013 | Teng .................... | H04N 19/176 375/240.12 |

(Continued)

FOREIGN PATENT DOCUMENTS

| | | |
|---|---|---|
| WO | 2013006370 A1 | 1/2013 |
| WO | 2016186563 A1 | 11/2016 |

OTHER PUBLICATIONS

ITU-T H.265, Series H: Audiovisual and Multimedia Systems, Infrastructure of audiovisual services—Coding of moving video, Advanced video coding for generic audiovisual services, The International Telecommunication Union. Apr. 2015, 634 pp.

(Continued)

*Primary Examiner* — Francis Geroleo
(74) *Attorney, Agent, or Firm* — Shumaker & Sieffert, P.A.

(57) ABSTRACT

In one example, a device for accessing image data includes a memory configured to store image data and one or more processors configured to code a plurality of bit length values for a plurality of block fixed length code length (bflc_len) values for a plurality of blocks of a tile or sub-tile of an image, the bit length values representing numbers of bits used to code the blfc_len values, code the bflc_len values for each of the plurality of blocks such that the bflc_len values have numbers of bits indicated by the respective bit length values, code the codewords for each of the plurality of blocks such that the codewords have the numbers of bits indicated by the bflc_len values for corresponding blocks of the plurality of blocks, and access the bit length values, the bflc_len values, and the codewords in the memory.

30 Claims, 10 Drawing Sheets

(56) References Cited

U.S. PATENT DOCUMENTS

2015/0358645 A1   12/2015   Thirumalai et al.

OTHER PUBLICATIONS

CCITT: "Terminal Equipment and Protocols for Telematic Services Information Technology—Digital Compression and Coding of Continuous-Tone Still Images—Requirements And Guidelines; Recommendation T.81", Sep. 1, 1992 (Sep. 1, 1992), pp. 132-136, XP055511733, Geneva, Switzerland, Retrieved from the Internet: URL: https://www.w3.org/Graphics/JPEG/itu-t81.pdf, [retrieved on Oct. 2, 2018].
International Search Report and Written Opinion—PCT/US2018/043580—ISA/EPO—dated Oct. 22, 2018—16 pp.
Mcanlis C., et al., "Chapter 8: Contextual Data Transforms", In: "Understanding Compression Data Compression for Modern Developers", Jul. 11, 2016 (Jul. 11, 2016), O'Reilly Media, Inc., Sebastopol, CA, USA, XP055512210, ISBN: 978-1-4919-6153-7, pp. 111-133.

* cited by examiner

STORING AND RETRIEVING HIGH BIT DEPTH IMAGE DATA

TECHNICAL FIELD

This disclosure relates to storage and retrieval of image data.

BACKGROUND

Image data is used in a variety of applications, such as pictures and videos. Raw image data (that is, uncoded or decoded image data, such as pictures, video, graphics, or display data) is often stored prior to encoding, following decoding, following rendering, and/or in a display buffer for image data to be displayed. Storage and retrieval of raw image data tends to suffer bandwidth limitations in core processing systems, such as video, image, graphics, and display core systems.

In image processing systems such as video, image, and graphics processing pipelines, raw data is accessed (e.g., fetched or stored) as needed for processing by intermediate modules. For example, in the case of video processing, intermediate modules fetch and store raw data in the form of reference pixel data, original pixel data, reconstructed pixel data, and the like. Such data access requires high bandwidth (BW) usage, which leads to high power consumption. This is especially true for higher bit-depth (i.e., more than 8 bits/sample) data used in those pipelines (e.g., 10- or 12-bit high dynamic range (HDR) video processing). In such cases, the situation will be even worse with the burden of memory access (both internal and external memory) significantly increased due to data size misalignment. Usually, padding is needed for such higher bit-depth data to make the bits of the samples aligned with the normal word or byte memory accessing boundaries.

For example, 10-bit pixels may be stored in a 16-bit memory unit (such as in a P010 format), with 6 bits used only for padding purposes and not contributing to the actual sample value. Direct access of such data incurs a 37.5% bandwidth waste.

As another example, three 10-bit pixels could be stored into a 32-bit memory unit, with 2 bits unused for padding purpose. Direct access of such data incurs at least 6.25% bandwidth waste.

Raw data compression has been used to address the bandwidth issue for storage and retrieval of raw image data. One example raw data compression scheme is a tile-based approach that allows image data to be randomly accessed based on a random access unit (RAU), e.g., a tile.

SUMMARY

In general, this disclosure describes techniques for accessing (e.g., storing and retrieving) image data, such as raw data. In particular, a processor may code image data using residual values representing differences between predicted pixel values and actual pixel values. The processor may use codewords of a particular bit length to represent residual values. The processor may determine the bit lengths for the codewords for each of a plurality of blocks of a tile or sub-tile of the image. The bit lengths for the codewords may be referred to as block fixed length code length (bflc_len) values. The processor may use the bflc_len values to determine a number of bits to store and/or retrieve for each codeword, and thus, may store/retrieve data representing the bflc_len values as well. Moreover, the processor may code bit length values representing numbers of bits used to represent each of the bflc_len values.

For example, the processor may code the bflc_len values as differences between the bflc_len values and a minimum bflc_len value for the tile or sub-tile. Moreover, the processor may code the bflc_len difference values using a number of bits that the processor determines dynamically based on the actual number of bits needed to store the bflc_len difference values. The processor may code the difference between a predicted number of bits for the bflc_len difference values (determined based on a bit depth for the image) and the actual number of bits needed to store the bflc_len difference values, and store/retrieve this difference value as well. By dynamically determining the number of bits needed to represent the bflc_len values, and/or the bflc_len difference values, the techniques of this disclosure may achieve a reduction in bitrate relative to conventional techniques.

In one example, a method of accessing image data includes coding, by one or more processors of a device, the one or more processors implemented in circuitry, a plurality of bit length values for a plurality of block fixed length code length (bflc_len) values for a plurality of blocks of a tile or sub-tile of an image, the bit length values representing numbers of bits used to code the blfc_len values, and the bflc_len values representing numbers of bits used to code codewords representing residual values for pixels of the tile or sub-tile corresponding to the respective blocks, coding, by the one or more processors, the bflc_len values for each of the plurality of blocks such that the bflc_len values have the numbers of bits indicated by the respective bit length values, coding, by the one or more processors, the codewords for each of the plurality of blocks such that the codewords have the numbers of bits indicated by the bflc_len values for corresponding blocks of the plurality of blocks, and accessing, by the one or more processors, the bit length values, the bflc_len values, and the codewords in a memory of the device.

In another example, a method of accessing image data includes coding, by one or more processors of a device, the one or more processors implemented in circuitry, a minimum value of a plurality of block fixed length code length (bflc_len) values for a plurality of blocks of a tile or sub-tile of an image, the bflc_len values representing numbers of bits used to code codewords representing residual values for pixels of the tile or sub-tile, determining, by the one or more processors, a predicted number of bits to be used to represent differences between the bflc_len values for the plurality of blocks of the tile or sub-tile and the minimum value, coding, by the one or more processors, a difference value representing a difference between the predicted number of bits and an actual number of bits needed to represent the differences between the bflc_len values for the plurality of blocks of the tile or sub-tile and the minimum value, coding, by the one or more processors, the differences between the bflc_len values for the plurality of blocks of the tile or sub-tile and the minimum value using codewords having numbers of bits equal to the difference between the predicted number of bits and the difference value, coding, by the one or more processors, the codewords for each of the plurality of blocks such that the codewords have numbers of bits indicated by the bflc_len values for corresponding blocks of the plurality of blocks, and accessing, by the one or more processors, the minimum value, the difference value representing the difference between the predicted number of bits and the actual number of bits, the differences between the bflc_len values and the minimum value, and the codewords in a memory of the device.

In another example, a device for accessing image data includes a memory configured to store image data, and one or more processors implemented in circuitry and configured to code a plurality of bit length values for a plurality of block fixed length code length (bflc_len) values for a plurality of blocks of a tile or sub-tile of an image, the bit length values representing numbers of bits used to code the blfc_len values, and the bflc_len values representing numbers of bits used to code codewords representing residual values for pixels of the tile or sub-tile corresponding to the respective blocks, code the bflc_len values for each of the plurality of blocks such that the bflc_len values have the numbers of bits indicated by the respective bit length values, code the codewords for each of the plurality of blocks such that the codewords have the numbers of bits indicated by the bflc_len values for corresponding blocks of the plurality of blocks, and access the bit length values, the bflc_len values, and the codewords in the memory.

In another example, a device for accessing image data includes a memory configured to store image data, and one or more processors implemented in circuitry and configured to code a minimum value of a plurality of block fixed length code length (bflc_len) values for a plurality of blocks of a tile or sub-tile of an image, the bflc_len values representing numbers of bits used to code codewords representing residual values for pixels of the tile or sub-tile, determine a predicted number of bits to be used to represent differences between the bflc_len values for the plurality of blocks of the tile or sub-tile and the minimum value, code a difference value representing a difference between the predicted number of bits and an actual number of bits needed to represent the differences between the bflc_len values for the plurality of blocks of the tile or sub-tile and the minimum value, code the differences between the bflc_len values for the plurality of blocks of the tile or sub-tile and the minimum value using codewords having numbers of bits equal to the difference between the predicted number of bits and the difference value, code the codewords for each of the plurality of blocks such that the codewords have numbers of bits indicated by the bflc_len values for corresponding blocks of the plurality of blocks, and access the minimum value, the difference value representing the difference between the predicted number of bits and the actual number of bits, the differences between the bflc_len values and the minimum value, and the codewords in the memory.

In another example, a device for accessing image data includes a memory configured to store media data, means for coding a plurality of bit length values for a plurality of block fixed length code length (bflc_len) values for a plurality of blocks of a tile or sub-tile of an image, the bit length values representing numbers of bits used to code the blfc_len values, and the bflc_len values representing numbers of bits used to code codewords representing residual values for pixels of the tile or sub-tile corresponding to the respective blocks, means for coding the bflc_len values for each of the plurality of blocks such that the bflc_len values have the numbers of bits indicated by the respective bit length values, means for coding the codewords for each of the plurality of blocks such that the codewords have the numbers of bits indicated by the bflc_len values for corresponding blocks of the plurality of blocks, and means for accessing the bit length values, the bflc_len values, and the codewords in the memory.

In another example, a device for accessing image data includes a memory configured to store media data, means for coding a minimum value of a plurality of block fixed length code length (bflc_len) values for a plurality of blocks of a tile or sub-tile of an image, the bflc_len values representing numbers of bits used to code codewords representing residual values for pixels of the tile or sub-tile, means for determining a predicted number of bits to be used to represent differences between the bflc_len values for the plurality of blocks of the tile or sub-tile and the minimum value, means for coding a difference value representing a difference between the predicted number of bits and an actual number of bits needed to represent the differences between the bflc_len values for the plurality of blocks of the tile or sub-tile and the minimum value, means for coding the differences between the bflc_len values for the plurality of blocks of the tile or sub-tile and the minimum value using codewords having numbers of bits equal to the difference between the predicted number of bits and the difference value, means for coding the codewords for each of the plurality of blocks such that the codewords have numbers of bits indicated by the bflc_len values for corresponding blocks of the plurality of blocks, and means for accessing the minimum value, the difference value representing the difference between the predicted number of bits and the actual number of bits, the differences between the bflc_len values and the minimum value, and the codewords in the memory.

In another example, a computer-readable storage medium has stored thereon instructions that, when executed, cause a processor of a device to code a plurality of bit length values for a plurality of block fixed length code length (bflc_len) values for a plurality of blocks of a tile or sub-tile of an image, the bit length values representing numbers of bits used to code the blfc_len values, and the bflc_len values representing numbers of bits used to code codewords representing residual values for pixels of the tile or sub-tile corresponding to the respective blocks, code the bflc_len values for each of the plurality of blocks such that the bflc_len values have the numbers of bits indicated by the respective bit length values, code the codewords for each of the plurality of blocks such that the codewords have the numbers of bits indicated by the bflc_len values for corresponding blocks of the plurality of blocks, and access the bit length values, the bflc_len values, and the codewords in a memory of the device.

In another example, a computer-readable storage medium has stored thereon instructions that, when executed, cause a processor of a device to code a minimum value of a plurality of block fixed length code length (bflc_len) values for a plurality of blocks of a tile or sub-tile of an image, the bflc_len values representing numbers of bits used to code codewords representing residual values for pixels of the tile or sub-tile, determine a predicted number of bits to be used to represent differences between the bflc_len values for the plurality of blocks of the tile or sub-tile and the minimum value, code a difference value representing a difference between the predicted number of bits and an actual number of bits needed to represent the differences between the bflc_len values for the plurality of blocks of the tile or sub-tile and the minimum value, code the differences between the bflc_len values for the plurality of blocks of the tile or sub-tile and the minimum value using codewords having numbers of bits equal to the difference between the predicted number of bits and the difference value, code the codewords for each of the plurality of blocks such that the codewords have numbers of bits indicated by the bflc_len values for corresponding blocks of the plurality of blocks, and access the minimum value, the difference value representing the difference between the predicted number of bits and the actual number of bits, the differences between the bflc_len values and the minimum value, and the codewords in a memory of the device.

The details of one or more examples are set forth in the accompanying drawings and the description below. Other features, objects, and advantages will be apparent from the description and drawings, and from the claims.

DETAILED DESCRIPTION

Figure 1:
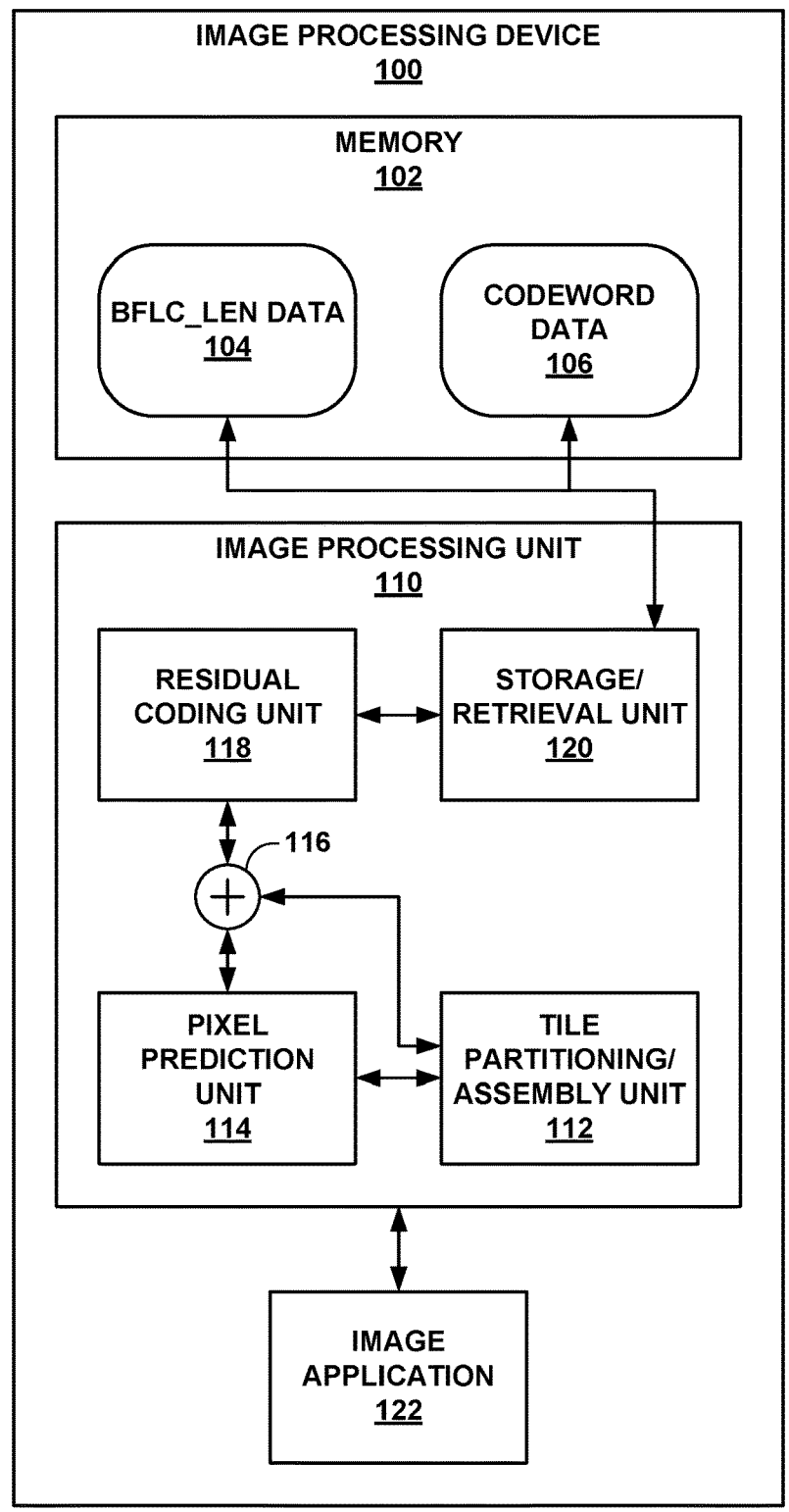
FIG. 1 is a block diagram illustrating an example system that implements techniques for accessing image data in accordance with the techniques of this disclosure.

In general, this disclosure describes techniques for accessing (e.g., storing and/or retrieving) image data. Such techniques generally include accessing (e.g., storing and/or retrieving) image data in a memory in a bandwidth-efficient manner. In particular, when storing image data for example, a processing unit may partition the image into individual tiles of pixels. The processing unit may predict values for the pixels, e.g., using left- and/or above-neighboring pixels, and calculate residual values for the pixels representing differences between the predicted values and the actual values. To encode the residual values, in accordance with certain examples of the techniques of this disclosure, the processing unit may determine codewords for the residual values and form a block (or group) of the codewords, e.g., four codewords per block (and thus, four residual values per block, in this example). In some examples, the codewords may represent index values, where the index values are unsigned representations of the signed residual values. The processing unit may then determine a maximum bitlength of codewords of the block. The processing unit may then assign codewords to each of the index values in the block, each of the codewords having the maximum bitlength, and store the codewords, as well as a value representative of the maximum bitlength, to a memory. The processing unit may further represent the codewords using numbers of bits indicated by, e.g., block fixed length code length (bflc_len) values. Moreover, the processing unit may code bit length values representing the number of bits used to express the bflc_len values. The processing unit may determine the number of bits to express the bflc_len values dynamically, in accordance with the techniques of this disclosure.

To retrieve the image data, the processing unit may perform a reciprocal process. That is, the processing unit may predict the pixels using reconstructed pixel values of left- and/or above-neighboring pixels. The processing unit may retrieve the value representing the maximum bitlength for a block (or group) of index values from the memory. The processing unit may then retrieve a number of bits from the memory equal to the maximum bitlength for each of the codewords. If, for example, the block of index values includes four index values, and the maximum bitlength value is four, the processing unit may retrieve sixteen bits from the memory, four for each codeword. The processing unit may then determine the index values from the codewords, and the residual values from the index values. Then, the processing unit may reconstruct the pixel values by adding the predicted pixel values to the residual values.

More particularly, in some examples, to code the bit length values representing the number of bits for each of the bflc_len values, the techniques of this disclosure may include coding a minimum length of the codewords for a tile or sub-tile, and representing the number of bits needed for codewords of each block of index values as a difference relative to the minimum length. The minimum length may be referred to as "min_bflc_len," and the differences relative to the minimum length may be referred to as "bflc_len_diff." Furthermore, the number of bits used to represent the bflc_len_diff values may be predicted based on a bit depth of the image, and a difference between this predicted number of bits and the actual number of bits needed to represent the bflc_len_diff values may be recorded for the tile or sub-tile in a memory. This difference may be referred to as "bflc_header_bit_diff." Thus, ultimately, the techniques of this disclosure may include storing and/or retrieving a bflc_header_bit_diff value for a tile or sub-tile of an image, a min_bflc_len value for the tile or sub-tile, bflc_len_diff values for codewords of blocks of index values of the tile or sub-tile, and the codewords themselves in a memory. The bflc_len_diff values may each be expressed by a number of bits equal to the difference between the predicted number of bits and the bflc_header_bit_diff value, while the codewords may be expressed by a number of bits equal to the bflc_len_diff value for a block corresponding to the codeword plus the min_bflc_len value.

The techniques of this disclosure may be used as part of a raw data compression scheme. One example raw data compression scheme is a tile based compression for which tiles are random-access units (RAUs), and a tile can be sub-divided into sub-tiles. Each sub-tile component (e.g., pixels) may be predicted independently from the other sub-tile components. In some examples, there is no prediction between different sub-tiles or different video components (e.g., frames or images).

As explained in greater detail below, these techniques may be performed in a variety of contexts. For example, these techniques may be used to store raw image data in a still image camera, a video camera, a graphics processing pipeline, a display buffer, or in other contexts.

Heuristic testing of the techniques of this disclosure have shown an improvement of 5% in compression relative to conventional raw data compression techniques, e.g., in which codeword bit length values are determined statically based on component bit depths, rather than dynamically as in the techniques of this disclosure.

Conventional raw data compression techniques may involve using block fixed length coding (BFLC). BFLC uses fixed-length codewords to code each index value within a block (where the index value represents a residual value of a pixel). BFLC also specifies the length (number of bits) of the codeword (denoted as bflc_len) in a fixed-length code separately. The length of the codeword (bflc_len) for each index within a block is fixed, but could be different for each block (unlike traditional entropy codes, such as variable length coding (VLC), for which each codeword's length could be different). The codeword length of conventional BFLC is based on the bitdepth needed to represent all index values within a block, i.e., the maximum index value in that block can be represented by codeword length (bflc_len). For instance, the codeword length for BFLC to cover index value (index) ranging from 0 to 1023 is 10 bits.

According to conventional BFLC, a BFLC length (bflc_len) value is calculated per block and represents the minimum length required to cover the range of values up to the maximum index in the block. For instance, if a block contains four index values {11, 0, 14, 7}, and its bflc_len is four (i.e., the minimum length codeword needed for this block is four bits), since four bits is sufficient to cover the range from 0 to 14. In this example, the index values are always non-negative. In conventional BFLC, the bflc_len value is represented as an n-bit field, where n is determined based on a component bitdepth. Thus, each index in a block is coded using bflc_len bits.

Thus, in conventional BFLC, a fixed length codeword is used to code bflc_len, where this codeword's bit length is based on an image component bitdepth. However, this disclosure recognizes that, because BFLC is used to encode residuals after prediction, the residuals typically have a small dynamic range within a block. The techniques of this disclosure may be used to reduce bitrate of coding in BFLC by using dynamically determined codewords for coding bflc_len.

FIG. 1 is a block diagram illustrating an example image processing device 100 that may perform the techniques of this disclosure. In this example, image processing device 100 includes memory 102, image processing unit 110, and image application 122. Image application 122 represents one or more image applications that may store and/or retrieve data to/from memory 102. For example, image application 122 may represent an application that receives one or more still images from a camera (not shown) of image processing device 100. As another example, image application 122 may represent a computer graphics program, such as a video game, ray tracing program, computer graphics generation program for digital movie production, or the like. As still another example, image application 122 may represent a controller for a display buffer (not shown) that stores images until the images are ready to be displayed on a display (not shown) coupled to or incorporated into image processing device 100.

Memory 102 may represent any of a variety of computer-readable storage media for storing data. For example, memory 102 may represent a random access memory (RAM), such as dynamic random access memory (DRAM), extended data-out RAM (EDO RAM), synchronous DRAM (SDRAM), double data rate SDRAM (DDR SDRAM), or the like. Alternatively, memory 102 may represent read-only memory (ROM), such as programmable ROM (PROM), erasable programmable ROM (EPROM), electronically erasable programmable read only memory (EEPROM), or the like. As still another example, memory 102 may represent a hard disk, flash drive, solid state drive, tape drive, or the like. Furthermore, memory 102 may include any combination of these or other computer-readable storage media.

Image processing unit 110 provides access to image data stored on memory 102 by image application 122 in the example of FIG. 1. In this example, image processing unit 110 includes tile partitioning/assembly unit 112, pixel prediction unit 114, addition/subtraction unit 116, residual coding unit 118, and storage/retrieval unit 120.

When storing an image to memory 102, image processing unit 110 may initially receive the image from image application 122. Image processing unit 110 passes the image to tile partitioning/assembly unit 112, which partitions the image into individual tiles of pixels. The tiles may have fixed or variable sizes, which may be square, rectangular, or non-rectangular shapes. For example, the tiles may have square or rectangular shapes defined by the number of pixels included in the tiles, such as 4×4, 4×8, 8×4, 8×8, 16×4, 16×8, 16×16, 4×16, 8×16, 32×4, 32×8, 32×16, 32×32, 4×32, 8×32, 16×32, and so on. The tiles of an image may have a common size or different sizes. Tile-based partitioning may take advantage of correlation of neighboring pixels in an image for better compression efficiency, and also offer the ease of random access and processing. Tile shape and size may be dependent on user implementation preferences and/or requirements of image application 122.

After tile partitioning/assembly unit 112 partitions an image into tiles, the remaining components of image processing unit 110 may process the tiles according to the techniques of this disclosure. For example, pixel prediction unit 114 may predict values for pixels of a tile based on previously coded pixels of the tile. Assuming the pixels are processed in a raster scan order, pixel prediction unit 114 may use a value of "0" as a predictor for the upper-left pixel of the tile. Then, for subsequent pixels of the tile in the top row, pixel prediction unit 114 may predict the pixels using left-neighboring pixels. After predicting the top row of pixels, pixel prediction unit 114 may predict the remaining pixels of the tile using left-, above-left, and/or above-neighboring pixels. Pixel prediction unit 114 may signal values for syntax elements indicating whether pixels are predicted from left- and/or above-neighboring pixels, in some examples. Using such a prediction strategy, all predictors are within the current tile, and therefore there is no dependency between tiles, which allows the techniques of this disclosure to be random access friendly.

In some examples, pixel prediction unit 114 may use a parallelogram prediction scheme. That is, pixel prediction unit 114 may generally predict a pixel value using pixel values from left-neighboring, above-neighboring, and above-left-neighboring pixels. For example, pixel prediction unit 114 may calculate a predicted value P as being equal to A+B-C, where A represents the pixel value of the left-neighboring pixel, B represents the pixel value of the above-neighboring pixel, and C represents the pixel value of the above-left-neighboring pixel.

Addition/subtraction unit 116 calculates residual values for the pixels of the tile. In particular, addition/subtraction unit 116 calculates the difference between an actual value for a pixel and the predicted value for the pixel as the residual value for the pixel. In particular, addition/subtraction unit 116 may calculate a residual value, or prediction error 'e', as being equal to the actual pixel value for the pixel minus the predicted value. In this manner, addition/subtraction unit 116 produces a tile of residual values.

Residual coding unit 118 may then encode the residual values according to the techniques of this disclosure. In some examples, residual coding unit 118 initially determines index values for each of the residual values in a block or group of pixels (e.g., four pixels of a tile). In some examples, residual coding unit 118 may calculate the index value for a residual value as (|e|<<1)−s, where e represents the signed residual value (or prediction error), "<<" represents the bitwise left-shift operator, and s is equal to 1 when e is negative (i.e., e<0) or s is equal to 0 when e is positive (i.e., e≥0). In this manner, the last bit of the index value represents whether the corresponding residual value is positive or negative, but the index value itself is a non-negative value.

Residual coding unit 118 may then form a group of index values, e.g., four consecutive index values, of a current tile or sub-tile. In accordance with the techniques of this disclosure, residual coding unit 118 may dynamically determine a number of bits needed to represent each of the index values. In particular, residual coding unit 118 may determine codewords for each of the index values in the group having a bitlength that is no longer than the longest number of bits needed to represent the largest index value in the group. For example, if the largest index value in the group is "14," then the longest codeword needed is four bits, and thus, residual coding unit 118 would use codewords for each of the index values in the group having four bits. By using variable length codewords in this manner, a higher compression ratio can be achieved, relative to using fixed length codewords (e.g., codewords that are based on bit depth of the input media data).

In other words, after residual coding unit 118 determines all indexes of a block (e.g., four indexes per block), residual coding unit 118 may use the maximum value among these indexes to determine the bitdepth needed to represent all indexes in that block. This value of bitdepth may be referred to as "bflc_len," and there may be n bits to represent bflc_len value. For example, a block with index values {11, 0, 14, 7}, at least four bits are needed to represent 14 (the maximum value), and also four bits (the range from 0 to 15) are sufficient to represent other index values {0, 7, 11} in the block. In this case, this block's bflc_len value is four, and this bflc_len value itself needs two bits to be represented, i.e., n=2.

In some examples, after processing all blocks in a tile or subtile, residual coding unit 118 may determine minimum and maximum bflc_len values for the blocks of the tile/subtile. In general, residual coding unit 118 or another unit of image processing unit 110 may determine numbers of bits needed to express the bflc_len values themselves, and code bit length values representing these numbers of bits for each of the blfc_len values of a tile or sub-tile.

In one example, to code the bit length values for the bflc_len values, residual coding unit 118 may further determine differences between each bflc_len for each block and the minimum and/or maximum bflc_len values. For example, a sub-tile of 16×4 pixels may have sixteen blocks (each block being size 4×1 pixels, with four pixels in each block), resulting in 4×4 bflc_len values, e.g., as follows:

3 4 3 3
4 4 3 4
3 3 3 3
4 4 4 4

This sub-tile has a minimum bflc_len value (min_bflc_len) of 3 and a maximum bflc_len value (max bflc_len)

value of 4. Residual coding unit 118 may subtract the min_bflc_len values from each of the bflc_len values above, resulting in a matrix of bflc_len_diff values. For the example above, the matrix of bflc_len_diff values would be:

0 1 0 0
1 1 0 1
0 0 0 0
1 1 1 1

Residual coding unit 118 may encode these bflc_len_diff values using just one bit per block. Residual coding unit 118 may represent the number of bits needed to represent the bflc_len_diff values for a tile or sub-tile in the form of a bflc_header_bit_diff syntax element, which represents a difference between a predicted number of bits needed to represent bflc_len_diff values and an actual number of bits needed to represent bflc_len_diff values of a current tile or sub-tile. That is, the bflc_header_bit_diff syntax element may represent a difference between a number of bits needed to represent bflc_len_diff values as indicated based on bitdepth, represented in Table 1 below, and a number of bits needed to represent bflc_len_diff values of a current tile. Table 1 below represents an example number of bits for bflc_len as indicated by a component bitdepth. Such bflc_len bits have been determined in previous techniques for raw data compression. As explained above, in some examples, the n bits for bflc_len values of Table 1 may represent predicted numbers of bits for bflc_len values for a block. The bflc_len_diff value for each block may indicate that each block has this many or fewer bits for codeword lengths, according to the techniques of this disclosure, and therefore, the techniques of this disclosure may achieve a higher compression ratio that the previous techniques for raw data compression.

TABLE 1

| Component bitdepth (d) | n bits for bflc_len |
|---|---|
| 1-2 | 1 |
| 3-4 | 2 |
| 5-9 | 3 |
| 10-16 | 4 |
| 17-32 | 5 |

Residual coding unit 118 may produce one or more data structures for a tile or sub-tile including syntax elements having values representative of the codewords for the index values representing the residual values, as well as a bflc_header_bit_diff syntax element, a min_bflc_len syntax element, and bflc_len_diff syntax elements for each block of the tile or sub-tile. The min_bflc_len syntax element represents a minimum bflc_len value within the tile or sub-tile. The bflc_len_diff syntax elements may each represent differences between bflc_len and min_bflc_len syntax elements for each block of the tile or sub-tile.

Ultimately, storage/retrieval unit 120 accesses (e.g., stores and/or retrieves) data to/from memory 102 representing the image. After residual coding unit 118 forms the bflc_len data and codes the residual values using codewords representative of the index values for the residual values, residual coding unit 118 passes this data to storage/retrieval unit 120 for storage in memory 102. In particular, according to the techniques of this disclosure, storage/retrieval unit 120 stores both bflc_len data 104 and codeword data 106 to memory 102. Bflc_len data 104 includes data representing the bit length values representing numbers of bits needed to represent the bflc_len values and the bflc_len values themselves (where the bflc_len values are expressed using the numbers of bits indicated by the respective bit length values). In one example, the bit length values include a difference between the predicted number of bits to be used to represent bflc_len values (per Table 1) and an actual number of bits needed to represent the blfc_len values (i.e., bflc_header_bit_diff), the minimum bflc_len value (min_bflc_len), and the bflc_len_diff values having numbers of bits equal to the difference between the predicted number of bits and the difference value (i.e., the value of bflc_header_bit_diff). Codeword data 106 includes data representing actual codewords having bit lengths indicated by respective bflc_len values, which correspond to the minimum bflc_len value (min_bflc_len) plus the respective bflc_len_diff values.

After an image has been stored in this manner, image application 122 may request to retrieve the image. In essence, image processing unit 110 performs a reciprocal process to the process discussed above to retrieve the image. That is, storage/retrieval unit 120 retrieves the values of the syntax elements for bflc_len data 104, i.e., the bit length values for the bflc_len values and the bflc_len values themselves. In some examples, to retrieve the bit length values, storage/retrieval unit 120 retrieves syntax elements representing the number of bits needed to represent bflc_len_diff values of a current tile or sub-tile, the minimum bflc_len value for the current tile or sub-tile, the bflc_len_diff values for each block of the current tile or sub-tile, and codeword data 106 having the number of bits equal to the corresponding bflc_len values. In particular, storage/retrieval unit 120 retrieves the bflc_header_bit_diff from bflc_len data 104 of memory 102, indicating a difference between a predicted number of bits (e.g., per Table 1 above) and an actual number of bits for representing the bflc_len_diff values.

Storage/retrieval unit 120 may determine the predicted number of bits from Table 1 and subtracts the difference value (bflc_header_bit_diff) from the predicted number of bits, to determine the number of bits included in each bflc_len_diff value. Storage/retrieval unit 120 then retrieves values for each of the bflc_len_diff value such that the bflc_len_diff values have this determined number of bits (e.g., if two bits per value, storage/retrieval unit 120 retrieves two bits for each value from bflc_len data 104 of memory 102). Storage/retrieval unit 120 also retrieves the minimum bflc_len value (min_bflc_len) from bflc_len data 104 of memory 102.

Storage/retrieval unit 120 may then add each of the bflc_len_diff values to the min_bflc_len value to recover the bflc_len values for each block of the tile or sub-tile. Storage/retrieval unit 120 then retrieves the codewords from codeword data 106 for each block of the tile or sub-tile, such that each of the codewords have the determined number of bits indicated by the respective bflc_len values. Thus, for example, if the bflc_len value for a block of codewords is a value of three, storage/retrieval unit 120 retrieves three bits per codeword of the block.

Residual coding unit 118 reconstructs the residual values for each tile by determining, for example, index values corresponding to each of the codewords of a group of index values sharing the same length codewords. Residual coding unit 118 then determines the residual values from the index values. In particular, if a last (least-significant) bit of an index value is '1', residual coding unit 118 may determine that the residual value is negative (and add one to the index value), and otherwise, that the residual value is positive, and bitwise-right-shift the index value by one bit to reproduce the residual value. Residual coding unit 118 may perform this reconstruction process for each residual value of the tile or sub-tile.

Pixel prediction unit 114 predicts values for the pixels of the current tile as discussed above, e.g., from above-, left-, and/or above-left-neighboring pixels. Addition/subtraction unit 116 adds the predicted values to the residual values produced by pixel prediction unit 114 to reproduce the pixel values for a tile.

Ultimately, addition/subtraction unit 116 passes the pixel values for the tile to tile partitioning/assembly unit 112 to reconstruct the image (e.g., a bitstream) from the tiles. Tile partitioning/assembly unit 112 may then return the reconstructed image to image application 122.

Figure 2:
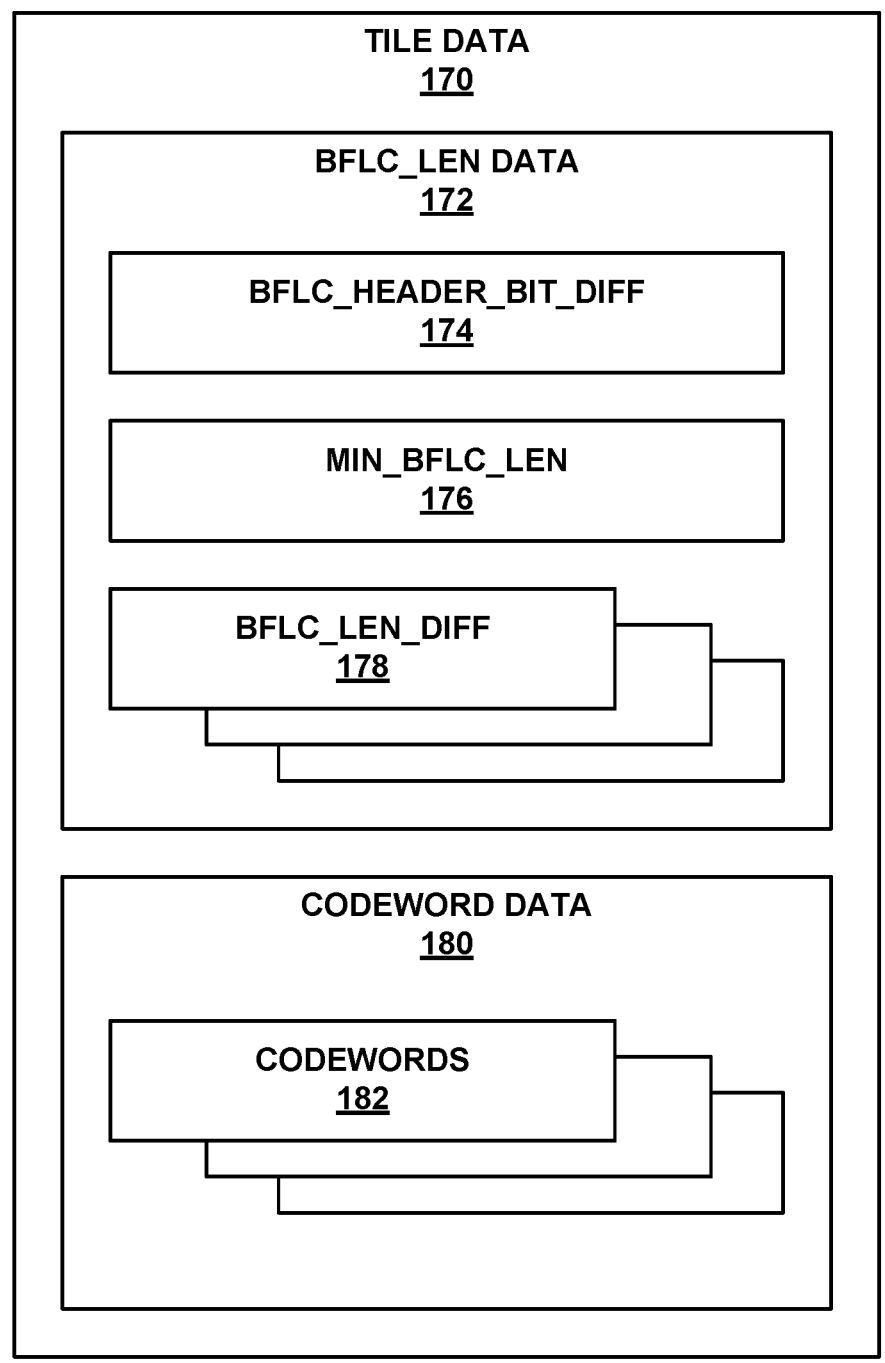
FIG. 2 is a conceptual diagram illustrating an example set of tile data that an image processing unit may store to/retrieve from a memory in accordance with the techniques of this disclosure.

FIG. 2 is a conceptual diagram illustrating an example set of tile data 170 that image processing unit 110 may store to/retrieve from memory 102 of FIG. 1. Tile data 170 generally includes block fixed length code length (bflc_len) data 172 and codeword data 180. Bflc_len data 172 may correspond to bflc_len data 104 of FIG. 1, while codeword data 180 may correspond to codeword data 106 of FIG. 1.

In this example, bflc_len data 172 includes bflc_header_bit_diff value 174, min_bflc_len 176, and bflc_len_diff values 178. As noted above, min_bflc_len value 176 represents a minimum bflc_len value for a tile or sub-tile corresponding to tile data 170. Likewise, bflc_len_diff values 178 represent differences between min_bflc_len value 176 and bflc_len values for blocks of the tile or sub-tile corresponding to tile data 170. Bflc_header_bit_diff represents a difference between a predicted number of bits needed to represent bflc_len_diff values 178 (e.g., indicated by Table 1 above) and an actual number of bits used to represent bflc_len_diff values 178. That is, each of bflc_len_diff values 178 is represented by a codeword having a bit length equal to the actual number of bits, i.e., the difference between the predicted number of bits and bflc_header_bit_diff value 174.

In this example, codeword data 180 includes codewords 182 for blocks of the tile or sub-tile corresponding to tile data 170. Codewords 182 may have different numbers of bits, except that codewords of the same block of the tile or sub-tile have the same number of bits (as indicated by bflc_len for the block). By adding min_bflc_len value 176 to one of the blfc_len_diff values 178 for a block, the bflc_len value for the block can be determined. That is, storage/retrieval unit 120 of FIG. 1 may add min_bflc_len value 176 to one of the blfc_len_diff values 178 for a block of the tile or sub-tile to determine the bflc_len value for the block. Storage/retrieval unit 120 may then retrieve codewords 182 for the block, the retrieved codewords having bit lengths equal to the bflc_len value for the block. Thus, storage/retrieval unit 120 may determine how many bits to retrieve for each of the codewords of a block according to the bflc_len value for the block.

FIG. 2 merely represents one example. In another example, bflc_len data 172 may simply include a plurality of bit length values representing numbers of bits in corresponding bflc_len values, and the bflc_len values themselves. The blfc_len values would each be expressed using the number of bits indicated by the bit length values. In the example of FIG. 2, blfc_header_bit_diff 174, min_bflc_len 176, and blfc_len_diff 178 represent examples of sets of data that can be used to code such bit length values.

Figure 3:
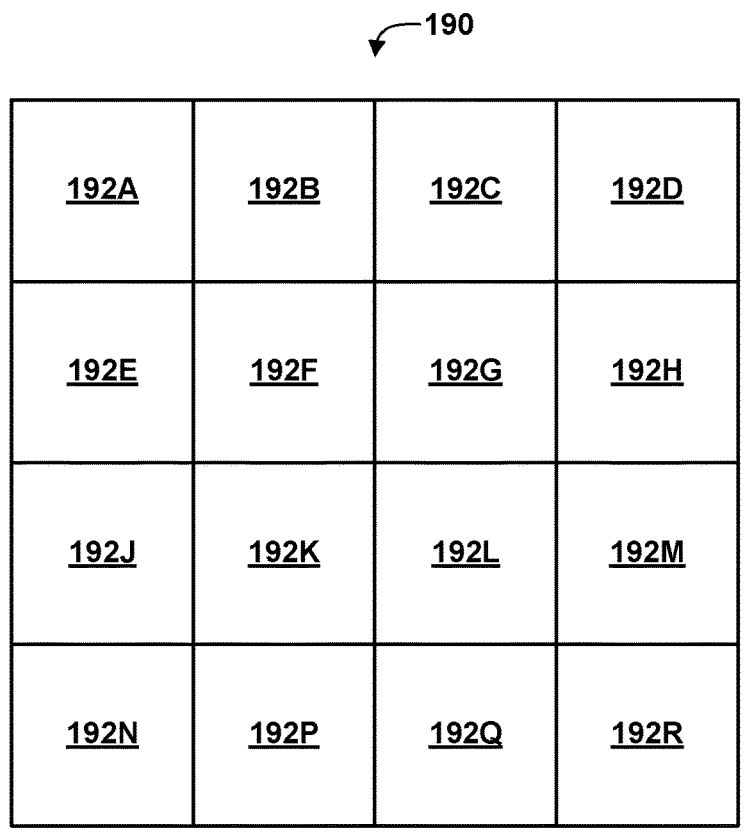
FIG. 3 is a conceptual diagram illustrating an example tile of residual values.

FIG. 3 is a conceptual diagram illustrating tile 190 of residual values 192A, 192B, 192C, 192D, 192E, 192F, 192G, 192H, 192J, 192K, 192L, 192M, 192N, 192P, 192Q, 192R (residual values 192). In one example, residual coding unit 118 may code residual values 192 in a raster scan order. That is, residual coding unit 118 may code the residual values in the following order: residual value 192A, residual value 192B, residual value 192C, residual value 192D, residual value 192E, residual value 192F, residual value 192G, residual value 192H, residual value 192J, residual value 192K, residual value 192L, residual value 192M, residual value 192N, residual value 192P, residual value 192Q, and residual value 192R. Alternatively, residual coding unit 118 may code residual values 192 in a different order, such as snake order. For snake order, residual coding unit 118 may code the residual values in the following order: residual value 192A, residual value 192B, residual value 192C, residual value 192D, residual value 192H, residual value 192G, residual value 192F, residual value 192E, residual value 192J, residual value 192K, residual value 192L, residual value 192M, residual value 192R, residual value 192Q, residual value 192P, and residual value 192N. In still other examples, other scan orderings may be used, such as reverse raster scan, top-to-bottom, bottom-to-top, zig-zag scan, or reverse zig-zag scan orders.

The residual value at the starting scan position may correspond to the actual pixel value. Assuming, for example, that the scan starts at residual value 192A, residual value 192A may be equal to the corresponding actual pixel value. That is, a predictor value of "0" may be used to calculate residual value 192A. Alternatively, a default predictor value may be used to predict the pixel at the position of residual value 192A.

Assuming that the scan order is raster scan order starting at residual value 192A, pixel prediction unit 114 may predict the pixel at the position of residual value 192B using residual value 192A. Likewise, pixel prediction unit 114 may predict the pixel at the position of residual value 192B using the pixel value at the position of residual value 192A, predict the pixel at the position of residual value 192C using the pixel value at the position of residual value 192B, and predict the pixel at the position of residual value 192D using the pixel value at the position of residual value 192C.

After predicting pixels in the top row (i.e., pixels at positions of residual values 192A-192D), pixel prediction unit 114 may predict values of subsequent pixels using values of above-, above-left, and/or left-neighboring pixels. For example, pixel prediction unit 114 may predict the value of the pixel at the position of residual value 192K using the values of the pixels at positions of residual values 192E, 192J, and/or 192F.

In one example, pixel prediction unit 114 may predict the value of a pixel at a position other than a top- or left-edge of tile 190 as the sum of the above- and left-neighboring pixels, minus the above-left-neighboring pixel. For example, pixel prediction unit 114 may predict the value of the pixel at the position of residual value 192K as the sum of the pixels at positions of residual values 192F and 192J minus the pixel at the position of residual value 192E.

Figure 4:
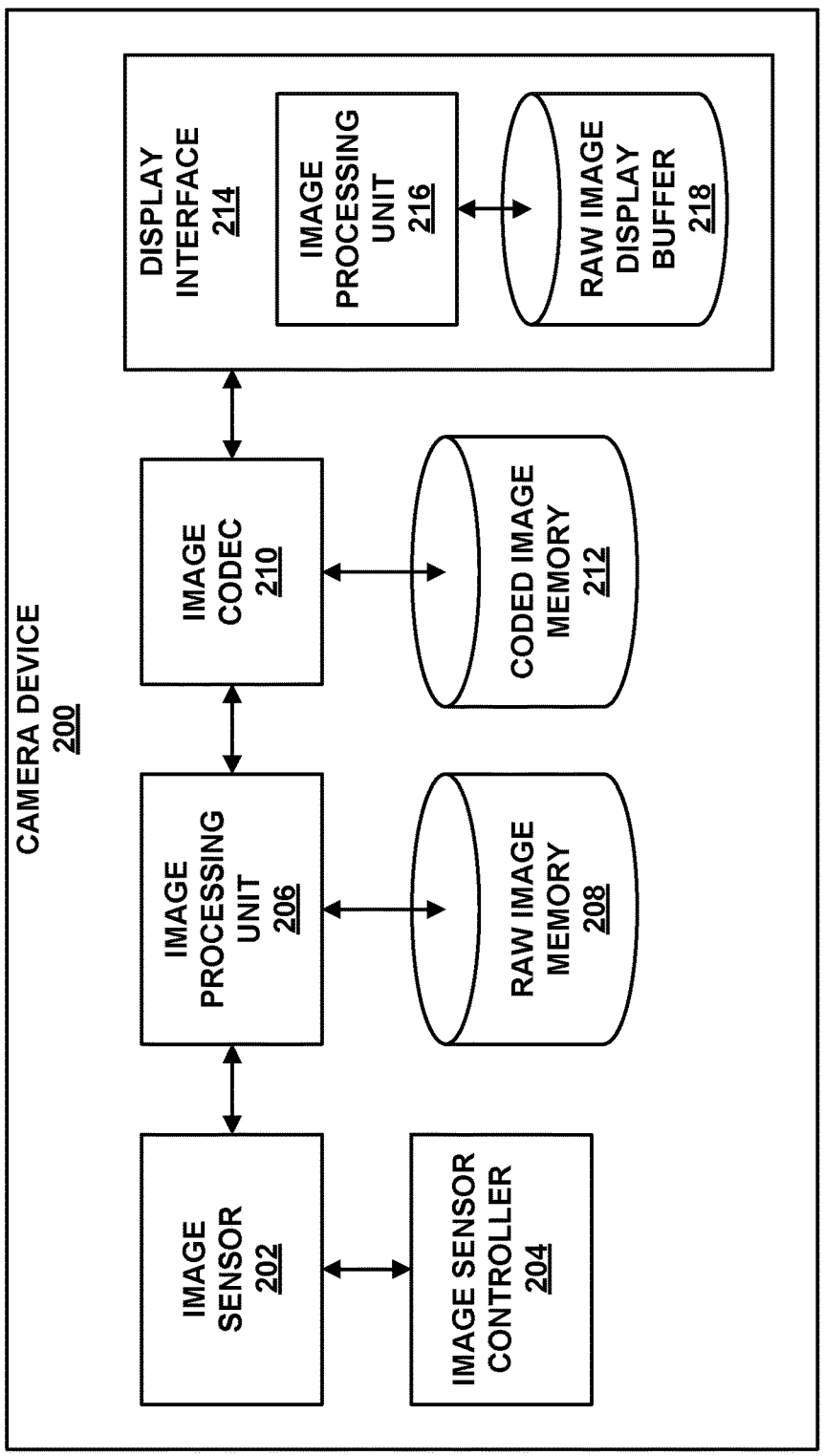
FIG. 4 is a block diagram illustrating an example camera device that may use the techniques of this disclosure.

FIG. 4 is a block diagram illustrating an example camera device 200 that may use the techniques of this disclosure. In this example, camera device 200 includes image sensor 202, image sensor controller 204, image processing unit 206, raw image memory 208, image codec (encoder/decoder) 210, coded image memory 212, and display interface 214. Display interface 214 includes image processing unit 216 and raw image display buffer 218.

In general, raw image memory 208 and raw image display buffer 218 may be configured similarly to memory 102 of FIG. 1. Similarly, as discussed below, image processing unit 206 and image processing unit 216 may each be configured similarly to image processing unit 110 of FIG. 1.

Image sensor 202 includes a sensor array for capturing image data in the visible light spectrum. For example, image sensor 202 may include one or more two-dimensional arrays of sensors for capturing red, green, and blue spectra light. Image sensor controller 204 controls image sensor 202. Image sensor controller 204 may include a user interface, such as a physical or virtual (e.g., touchscreen-displayed) button. Image sensor controller 204 may determine when a user has pressed the button and, in response to the user pressing the button, cause image sensor 202 to capture an image and pass raw image data for the image to image processing unit 206.

Image processing unit 206 may be configured according to the techniques of this disclosure to store the captured image to raw image memory 208. That is, image processing unit 206 may convert the image to a set of blocks (such as tile 190 of FIG. 3) including a number of pixels (arranged according to, e.g., residual values 192 of FIG. 3). Image processing unit 206 may predict values for the pixels, e.g., using left-, above-left-, and/or above-neighboring pixels, and calculate residual values for the pixels as differences between the current values and the predicted values. Image processing unit 206 may then encode the residual values using codewords representing index values for the residual values, as discussed above with respect to FIG. 1. That is, image processing unit 206 may encode bflc_len data and codeword data, where the bflc_len data may include a bflc_header_bit_diff for a tile or sub-tile of an image, a min_bflc_len for the tile or sub-tile, and a plurality of bflc_len_diff values for blocks of the tile or sub-tile.

Image codec 210 may ultimately retrieve the raw image from raw image memory 208 via image processing unit 206. Thus, in accordance with the techniques of this disclosure, image processing unit 206 may retrieve the image from raw image memory 208. In particular, image processing unit 206 may retrieve the bflc_len data and the codeword data as discussed above, e.g., with respect to FIG. 1. Image processing unit 206 may reproduce residual values from codewords of the codeword data. Image processing unit 206 may then combine the residual values with corresponding predicted values to reproduce the pixel values of the block. Image processing unit 206 may then assemble the tiles or sub-tiles to form all or part of the image, and pass the blocks to image codec 210.

Image codec 210 may be configured to encode and decode image data according to an image coding standard, such as Joint Photographic Experts Group (JPEG). In other examples, image codec 210 may represent a video codec configured to encode and decode video data according to a video coding standard, such as ITU-T H.264/AVC (Advanced Video Coding), ITU-T H.265 (High Efficiency Video Coding), or the like. An example of a video encoder is shown in and discussed with respect to FIG. 5 below. Moreover, a separate image processing unit from image processing unit 206 may be provided within the video codec, as explained with respect to FIG. 5.

Image codec 210 may store the encoded image to coded image memory 212. Raw image memory 208 and coded image memory 212 may represent separate portions (e.g., regions) of a common memory, or physically distinct computer-readable storage media.

Display interface 214 may subsequently request access to a coded image to cause the image to be displayed, e.g., on a display of camera device 200 (not shown). Accordingly, display interface 214 may retrieve the image from coded image memory 212 via image codec 210. Image codec 210 may decode the image in preparation for display. In accordance with the techniques of this disclosure, display interface 214 may include an image processing unit 216 and a raw image display buffer 218. Image processing unit 216 may store the raw (i.e., decoded) image to raw image display buffer 218 in accordance with the techniques of this disclosure, until the image is ready to be displayed on the display. When the image is to be displayed, image processing unit 216 may retrieve the image from raw image display buffer 218 according to the techniques of this disclosure, and pass the raw image to the display.

In this manner, camera device 200 represents an example of a device for storing image data, the device comprising a memory configured to store media data, and one or more processors implemented in hardware and configured to code a minimum value of a plurality of block fixed length code length (bflc_len) values for a plurality of blocks of a tile or sub-tile of an image, the bflc_len values representing numbers of bits used to code codewords representing residual values for pixels of the tile or sub-tile, determine a predicted number of bits to be used to represent differences between the bflc_len values for the plurality of blocks of the tile or sub-tile and the minimum value, code a difference value representing a difference between the predicted number of bits and an actual number of bits needed to represent the differences between the bflc_len values for the plurality of blocks of the tile or sub-tile and the minimum value, code the differences between the bflc_len values for the plurality of blocks of the tile or sub-tile and the minimum value using codewords having numbers of bits equal to the difference between the predicted number of bits and the difference value, code the codewords for each of the plurality of blocks such that the codewords have numbers of bits indicated by the bflc_len values for corresponding blocks of the plurality of blocks, and access the minimum value, the difference value representing the difference between the predicted number of bits and the actual number of bits, the differences between the bflc_len values and the minimum value, and the codewords in the memory.

Figure 5:
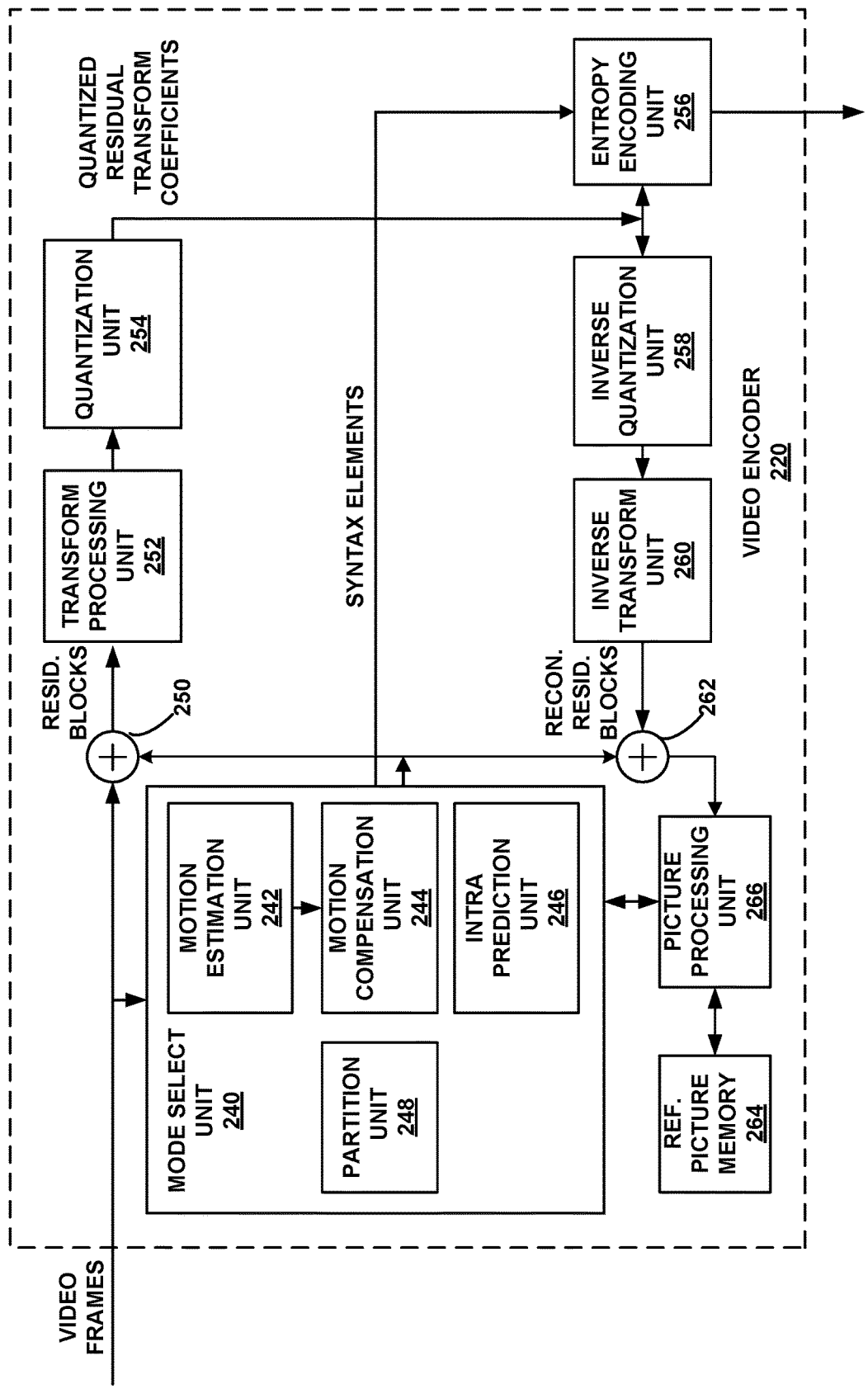
FIG. 5 is a block diagram illustrating an example video encoder including a picture processing unit that implements techniques for accessing high bit depth image data in accordance with the techniques of this disclosure.

FIG. 5 is a block diagram illustrating an example video encoder 220 including a picture processing unit 266 that implements techniques for storing high bit depth image data in accordance with the techniques of this disclosure. As explained in greater detail below, coding of video data may include inter-prediction and/or inter-prediction of the video data. Video encoder 220 may perform intra- and inter-prediction of video blocks within video slices. Intra-mode (I mode) may refer to any of several spatial based coding modes. Inter-modes, such as uni-directional prediction (P mode) or bi-prediction (B mode), may refer to any of several temporal-based coding modes.

Intra-prediction relies on spatial prediction to reduce or remove spatial redundancy in video within a given video frame or picture. Inter-prediction relies on temporal prediction to reduce or remove temporal redundancy in video within adjacent frames or pictures of a video sequence. Picture processing unit 266 stores previously encoded and then decoded image data in reference picture memory 264, in this example. Likewise, picture processing unit 266 retrieves such previously encoded and decoded image data from reference picture memory 264, in this example. Picture processing unit 266 may correspond to image processing unit 110 of FIG. 1. Thus, picture processing unit 266 may implement the techniques of this disclosure related to encoding and storing (or retrieving and decoding) bflc_len data and codeword data to or from reference picture memory 264.

Picture processing unit 266 may be configured according to the techniques of this disclosure to store the captured image to reference picture memory 264. That is, picture processing unit 266 may convert the image to a set of blocks (such as tile 190 of FIG. 3) including a number of pixels (arranged according to, e.g., residual values 192 of FIG. 3). Picture processing unit 266 may predict values for the pixels, e.g., using left-, above-left-, and/or above-neighboring pixels, and calculate residual values for the pixels as differences between the current values and the predicted values. Picture processing unit 266 may then encode the residual values using codewords representing index values for the residual values, as discussed above with respect to FIG. 1. That is, picture processing unit 266 may encode bflc_len data and codeword data, where the bflc_len data may include a bflc_header_bit_diff for a tile or sub-tile of an image, a min_bflc_len for the tile or sub-tile, and a plurality of bflc_len_diff values for blocks of the tile or sub-tile.

As shown in FIG. 5, video encoder 220 receives a current video block within a video frame to be encoded. In the example of FIG. 5, video encoder 220 includes mode select unit 240, reference picture memory 264 (which may also be referred to as a decoded picture buffer (DPB)), picture processing unit 266, summer 250, transform processing unit 252, quantization unit 254, and entropy encoding unit 256. Mode select unit 240, in turn, includes motion estimation unit 242, motion compensation unit 244, intra-prediction unit 246, and partition unit 248. For video block reconstruction, video encoder 220 also includes inverse quantization unit 258, inverse transform unit 260, and summer 262. A deblocking filter (not shown in FIG. 5) may also be included to filter block boundaries to remove blockiness artifacts from reconstructed video. If desired, the deblocking filter (or other filters) would typically filter the output of summer 262.

During the encoding process, video encoder 220 receives a video frame or slice to be coded. The frame or slice may be divided into multiple video blocks, e.g., by partition unit 248. Motion estimation unit 242 and motion compensation unit 244 perform inter-predictive encoding of received video blocks relative to one or more blocks in one or more reference frames to provide temporal prediction. Intra-prediction unit 246 may alternatively perform intra-predictive encoding of received video blocks relative to pixels of one or more neighboring blocks in the same frame or slice as the block to be coded, to provide spatial prediction. Video encoder 220 may perform multiple coding passes, e.g., to select an appropriate coding mode for each block of video data. Mode select unit 240 may retrieve reference data (e.g., neighboring pixel data in the case of intra-prediction or pixel data of previously encoded and decoded images in the case of inter-prediction) from reference picture memory 264 via picture processing unit 266.

Moreover, partition unit 248 may partition blocks of video data into sub-blocks, based on evaluation of previous partitioning schemes in previous coding passes. For example, partition unit 248 may initially partition a frame or slice into coding tree units (CTUs), and partition each of the CTUs into sub-coding units (CUs) based on rate-distortion analysis (e.g., rate-distortion optimization). Mode select unit 240 may further produce a quadtree data structure indicative of partitioning of a CTU into sub-CUs. Leaf-node CUs of the quadtree may include one or more prediction units (PUs) and one or more transform units (TUs).

Mode select unit 240 may select one of the prediction modes, intra or inter, e.g., based on error results, and provides the resulting predicted block to summer 250 to generate residual data and to summer 262 to reconstruct the encoded block for use as a reference frame. Mode select unit 240 also provides syntax elements, such as motion vectors, intra-mode indicators, partition information, and other such syntax information, to entropy encoding unit 256.

Motion estimation unit 242 calculates a motion vector for a PU of a video block in an inter-coded slice by comparing the position of the PU to the position of a predictive block of a reference picture stored in reference picture memory 264. The reference picture may be selected from a first reference picture list (List 0) or a second reference picture list (List 1), each of which identify one or more reference pictures stored in reference picture memory 264. Motion estimation unit 242 sends the calculated motion vector to entropy encoding unit 256 and motion compensation unit 244.

Motion compensation, performed by motion compensation unit 244, may involve fetching or generating the predictive block from reference picture memory 264 based on the motion vector determined by motion estimation unit 242. Motion estimation unit 242 and motion compensation unit 244 may be functionally integrated, in some examples. Upon receiving the motion vector for the PU of the current video block, motion compensation unit 244 may locate the predictive block to which the motion vector points in one of the reference picture lists, and prompt mode select unit 240 to retrieve the predictive block (or data used to generate the predictive block) from reference picture memory 264 via picture processing unit 266. Summer 250 forms a residual video block by subtracting pixel values of the predictive block from the pixel values of the current video block being coded, forming pixel difference values, as discussed below. In general, motion estimation unit 242 performs motion estimation relative to luma components, and motion compensation unit 244 uses motion vectors calculated based on the luma components for both chroma components and luma components. Mode select unit 240 may also generate syntax elements associated with the video blocks and the video slice for use by a video decoder in decoding the video blocks of the video slice.

Intra-prediction unit 246 may intra-predict a current block, as an alternative to the inter-prediction performed by motion estimation unit 242 and motion compensation unit 244, as described above. In particular, intra-prediction unit 246 may determine an intra-prediction mode to use to encode a current block. In some examples, intra-prediction unit 246 may encode a current block using various intra-prediction modes, e.g., during separate encoding passes, and intra-prediction unit 246 (or mode select unit 240, in some examples) may select an appropriate intra-prediction mode to use from the tested modes. After selecting an intra-prediction mode for a block, intra-prediction unit 246 may provide information indicative of the selected intra-prediction mode for the block to entropy encoding unit 256.

Video encoder 220 forms a residual video block by subtracting the prediction data generated by mode select unit 240 from the original video block being coded. Summer 250 represents the component or components that perform this subtraction operation. Transform processing unit 252 applies a transform, such as a discrete cosine transform (DCT) or a conceptually similar transform, to the residual block, producing a video block comprising transform coefficient values. The transform may convert the residual information from a pixel domain to a transform domain, such as a frequency domain. Transform processing unit 252 may send the resulting transform coefficients to quantization unit 254. Quantization unit 254 quantizes the transform coefficients to further reduce bit rate. The quantization process may reduce the bit depth associated with some or all of the coefficients. The degree of quantization may be modified by adjusting a quantization parameter.

Following quantization, entropy encoding unit 256 entropy encodes the quantized transform coefficients. For example, entropy encoding unit 256 may perform context adaptive variable length coding (CAVLC), context adaptive binary arithmetic coding (CABAC), syntax-based context-adaptive binary arithmetic coding (SBAC), probability interval partitioning entropy (PIPE) coding or another entropy coding technique. In the case of context-based entropy coding, context may be based on neighboring blocks. Following the entropy coding by entropy encoding unit 256, the encoded bitstream may be transmitted to another device or archived for later transmission or retrieval.

Inverse quantization unit 258 and inverse transform unit 260 apply inverse quantization and inverse transformation, respectively, to reconstruct the residual block in the pixel domain. In particular, summer 262 adds the reconstructed residual block to the motion compensated prediction block earlier produced by motion compensation unit 244 or intra-prediction unit 246 to produce a reconstructed video block for storage in reference picture memory 264 via picture processing unit 266. The reconstructed video block may be used by motion estimation unit 242 and motion compensation unit 244 as a reference block to inter-code a block in a subsequent video frame, or by intra-prediction unit 246 to intra-predict a subsequent block of a current video frame.

It should be understood that the encoding and decoding process performed by picture processing unit 266 is separate from the encoding and decoding process performed by video encoder 220, e.g., by mode select unit 240, summer 250, transform processing unit 252, quantization unit 254, inverse quantization unit 258, inverse transform unit 260, and summer 262. Thus, predicted values, residual values, and reconstructed values calculated by picture processing unit 266 are distinct from predicted values, residual values, and reconstructed values calculated by, e.g., mode select unit 240, summer 250, and summer 262, and serve different purposes.

In this example, picture processing unit 266 is separate from other units of video encoder 220. In other examples, picture processing unit 266 may be incorporated into, e.g., mode select unit 240. Furthermore, although only one picture processing unit 266 is shown in this example, in other examples, one or more additional picture processing units similar to picture processing unit 266 may be incorporated into video encoder 220. For example, a similar picture processing unit and picture memory may be used to store input raw image data provided to mode select unit 240 and summer 250 (that is, along the input line marked "VIDEO FRAMES").

In this manner, video encoder 220 of FIG. 5 represents an example of a device for storing image data, the device comprising a memory configured to store media data, and one or more processors implemented in hardware and configured to code a minimum value of a plurality of block fixed length code length (bflc_len) values for a plurality of blocks of a tile or sub-tile of an image, the bflc_len values representing numbers of bits used to code codewords representing residual values for pixels of the tile or sub-tile, determine a predicted number of bits to be used to represent differences between the bflc_len values for the plurality of blocks of the tile or sub-tile and the minimum value, code a difference value representing a difference between the predicted number of bits and an actual number of bits needed to represent the differences between the bflc_len values for the plurality of blocks of the tile or sub-tile and the minimum value, code the differences between the bflc_len values for the plurality of blocks of the tile or sub-tile and the minimum value using codewords having numbers of bits equal to the difference between the predicted number of bits and the difference value, code the codewords for each of the plurality of blocks such that the codewords have numbers of bits indicated by the bflc_len values for corresponding blocks of the plurality of blocks, and access the minimum value, the difference value representing the difference between the predicted number of bits and the actual number of bits, the differences between the bflc_len values and the minimum value, and the codewords in the memory.

Figure 6:
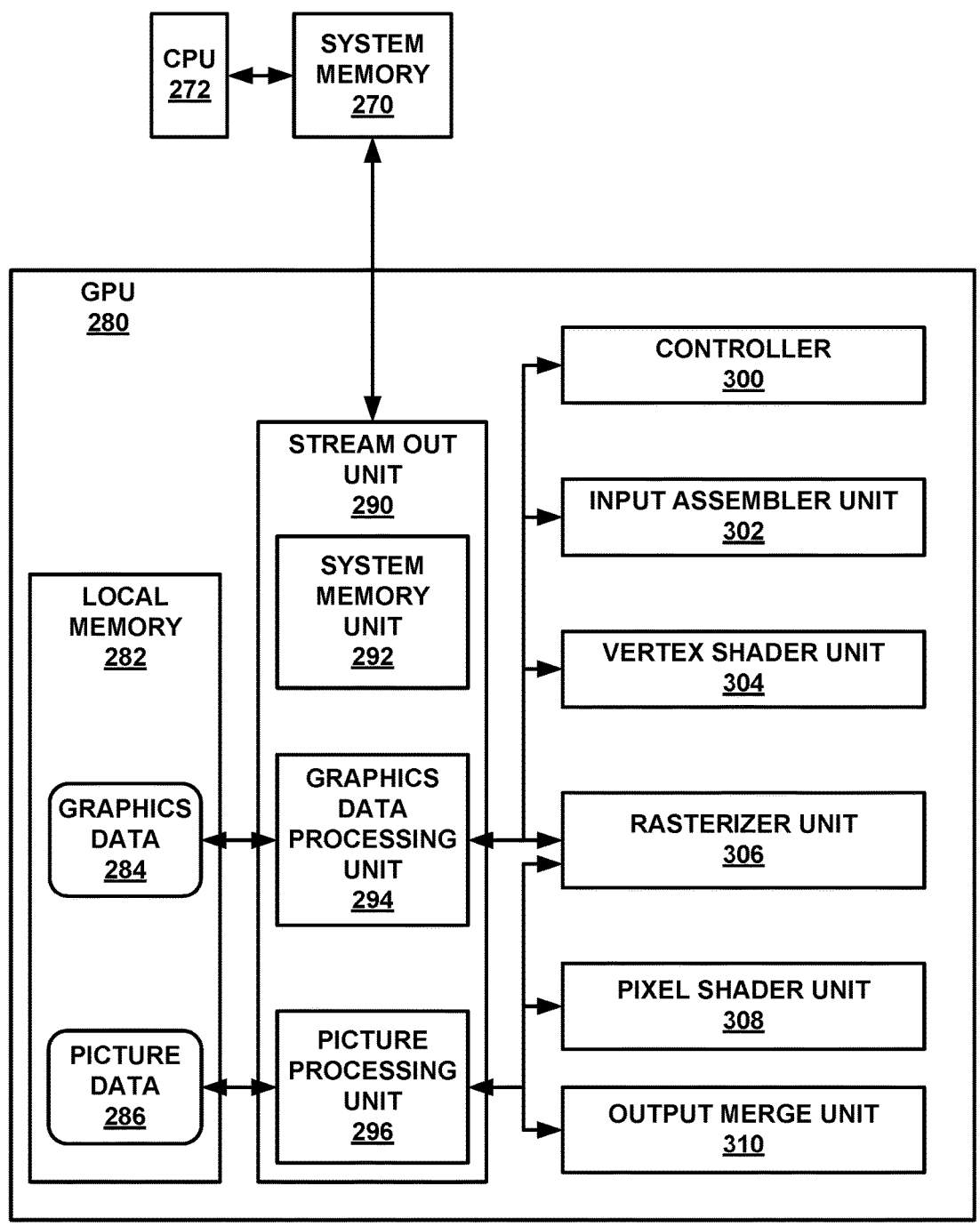
FIG. 6 is a block diagram illustrating an example of a graphics processing unit (GPU) including a picture processing unit that implements techniques for accessing high bit depth image data in accordance with the techniques of this disclosure.

FIG. 6 is a block diagram illustrating an example of a graphics processing unit (GPU) 280 including a picture processing unit that implements techniques for storing high bit depth image data in accordance with the techniques of this disclosure. To perform graphics operations, GPU 280 may implement a graphics processing pipeline. The graphics processing pipeline includes one or more units that perform functions as defined by software or firmware executing on GPU 280 and fixed-function units that are hardwired to perform very specific functions. The software or firmware executing on the GPU 280 may be referred to as shaders, and the shaders may execute on one or more shader cores of GPU 280. Shaders provide users with functional flexibility because a user can design the shaders to perform desired tasks in any conceivable manner. The fixed-function units, however, are hardwired for the manner in which the fixed-function units perform tasks.

In this example, GPU 280 includes input assembler unit 302, vertex shader unit 304, rasterizer unit 306, pixel shader unit 308, and output merge unit 310. GPU 280 may include addition units such a hull shader unit, tessellation unit, and/or domain shader unit (not shown in the example of FIG. 6) that follow vertex shader unit 304, in that order. GPU 280 may also include a geometry shader unit (not shown) coupled to the output of the domain shader unit, if GPU 280 includes a domain shader unit, or the output of the vertex shader unit 304, if GPU 280 does not include the domain shader unit. Rasterizer unit 306 may receive graphics data from vertex shader unit 304, as illustrated, or from a geometry shader unit (when available) or a domain shader unit (when available).

Other configurations of the graphics pipeline are possible, and the techniques described in this disclosure should not be considered limited to the specific example illustrated in FIG. 6. For example, GPU 280 may include more units than those illustrated, and in some examples, GPU 280 may not necessarily include all of the illustrated units. Also, the specific ordering of the units is provided for purposes of illustration and should not be considered limiting.

Input assembler unit 302 may read vertex points of vertices from system memory 270 as defined by CPU 272, and assemble control points to form vertices. For instance, input assembler unit 302 may read vertex point coordinates, color values, and other such information. The coordinates, color values, and other such information may be commonly referred to as attributes of the vertices. Based on the attributes of the vertices, input assembler unit 302 may determine the general layout of graphical primitives (e.g., triangles). In this manner, input assembler unit 302 may assemble the control points to form the patch. Input assembler unit 302 may be a fixed-function unit. Input assembler unit 302 may store data for the vertices as graphics data 284 in local memory 282 via graphics data processing unit 294 of stream out unit 290.

Vertex shader unit 304 may process the data for the vertices from input assembler unit 302. For example, vertex shader unit 304 may retrieve the data for the vertices from graphics data 284 of local memory 282 via graphics data processing unit 294. Vertex shader unit 304 may then perform per-vertex operations such as transformations, skinning, morphing, and per-vertex lighting. Vertex shader unit 304 may then store the resulting data for the vertices as part of graphics data 284 to local memory 282 via graphics data processing unit 294. Vertex shader unit 304 may be a shader.

Rasterizer unit 306 retrieves the data (e.g., graphics primitives) stored by vertex shader unit 304 from graphics data 284 of local memory 282 via graphics data processing unit 294. Rasterizer unit 306 may then convert the primitives into pixels for display. For example, the primitives may be defined as a set of interconnected vectors, and may be defined in a coordinate space that is independent of the display on which the image is to be displayed. Rasterizer unit 306 converts these vectors into display coordinates, and performs any additional functions, such as removing points within primitives that are occluded. Rasterizer unit 306 stores the resulting generated image as picture data 286 via picture processing unit 296.

Picture processing unit 296 may include components substantially similar to those of image processing unit 110 of FIG. 1. Picture processing unit 296 may be configured to perform the techniques of this disclosure. That is, picture processing unit 296 may receive an image from, e.g., rasterizer unit 306. Picture processing unit 296 may convert the image to a set of blocks (such as tile 190 of FIG. 3) including a number of pixels (arranged according to, e.g., residual values 192 of FIG. 3). Picture processing unit 296 may predict values for the pixels, e.g., using left-, above-left-, and/or above-neighboring pixels, and calculate residual values for the pixels as differences between the current values and the predicted values. Picture processing unit 296 may then encode the residual values using codewords representing index values for the residual values, as discussed above with respect to FIG. 1. That is, picture processing unit 296 may encode bflc_len data and codeword data, where the bflc_len data may include a bflc_header_bit_diff for a tile or sub-tile of an image, a min_bflc_len for the tile or sub-tile, and a plurality of bflc_len_diff values for blocks of the tile or sub-tile, and store this data as picture data 286 in local memory 282.

Subsequently, pixel shader unit 308 may retrieve the rasterized image generated by rasterizer unit 306. In particular, pixel shader unit 308 may retrieve the image from picture data 286 via picture processing unit 296. Thus, picture processing unit 296 may retrieve data for each tile of the image, including bflc_len data and codewords as discussed above. Picture processing unit 296 may determine residual values from index values represented by the codewords. Picture processing unit 296 may then add the residual values to corresponding predicted values for the pixels to regenerate the block. Picture processing unit 296 may perform this process for each block of the image to reconstruct the image, and then pass the image to pixel shader unit 208.

Pixel shader unit 308 post-processes pixels of the retrieved image to assign color values to each of the pixels that are to be displayed. For example, pixel shader unit 308 may receive constant values stored in system memory 270, texture data stored in system memory 270, and any other data to generate per-pixel outputs, such as color values. Pixel shader unit 308 may also output opacity values that indicate the opaqueness of the pixels. Pixel shader unit 308 may store the shaded image as picture data 286 via picture processing unit 296.

Output merge unit 310 may perform any final pixel processing on the post-processed image stored in picture data 286. In particular, output merge unit 310 may retrieve the post-processed image from picture data 286 via picture processing unit 296. Output merge unit 310 may use depth information to further determine whether any of the pixels should not be displayed. Output merge unit 310 may also perform blending operations to generate final pixel values. Output merge unit 310 may output the final pixel values to a frame buffer, generally located within system memory 270, but which may be located within GPU 280.

In the example illustrated in FIG. 6, each one of the units receives data from and outputs data to local memory 282 of GPU 280 via graphics data processing unit 294 or picture processing unit 296. Other examples of local memory exist in addition to or instead of local memory 282. As one example, the units may output data to and receive data from general purpose registers (GPRs). Unlike local memory 282, each of the GPRs may be configured to receive from and output to specific units, rather than being memory for each of the units. GPRs are another example of local memory of GPU 280.

Local memory 282 of GPU 280 stores intermediate data generated by respective units for subsequent retrieval of the intermediate data by the next unit for further processing. For example, input assembler unit 302 retrieves graphics data 284 of local memory 282, performs graphics processing on the retrieved graphics data, and generates first intermediate data that input assembler unit 302 stores in local memory 282 via graphics data processing unit 294. Vertex shader unit 304 retrieves this first intermediate data from local memory 282 via graphics data processing unit 294, performs graphics processing on this retrieved intermediate data, and generates second intermediate data, which vertex shader unit 304 stores as graphics data 284 via graphics data processing unit 294.

Furthermore, rasterizer unit 306, pixel shader unit 308, and output merge unit 310 access (e.g., store and/or retrieve) picture data 286 via picture processing unit 296, which again operates according to the techniques of this disclosure, as discussed above. In this manner, GPU 280 represents an example of a device for storing image data, the device comprising a memory configured to store media data, and one or more processors implemented in hardware and configured to code a minimum value of a plurality of block fixed length code length (bflc_len) values for a plurality of blocks of a tile or sub-tile of an image, the bflc_len values representing numbers of bits used to code codewords representing residual values for pixels of the tile or sub-tile, determine a predicted number of bits to be used to represent differences between the bflc_len values for the plurality of blocks of the tile or sub-tile and the minimum value, code a difference value representing a difference between the predicted number of bits and an actual number of bits needed to represent the differences between the bflc_len values for the plurality of blocks of the tile or sub-tile and the minimum value, code the differences between the bflc_len values for the plurality of blocks of the tile or sub-tile and the minimum value using codewords having numbers of bits equal to the difference between the predicted number of bits and the difference value, code the codewords for each of the plurality of blocks such that the codewords have numbers of bits indicated by the bflc_len values for corresponding blocks of the plurality of blocks, and access the minimum value, the difference value representing the difference between the predicted number of bits and the actual number of bits, the differences between the bflc_len values and the minimum value, and the codewords in the memory.

As illustrated, GPU 280 includes stream out unit 290 which is a hardware unit of GPU 280. That is, stream out unit 290 may be implemented using one or more physical processing units, e.g., processing units implemented using fixed and/or programmable logic circuitry. Stream out unit 290 may be configured to receive data from local memory 282, and more particularly, data generated by the graphics processing pipeline, and output that data to system memory 270. Stream out unit 290 may also be configured to receive data from system memory 270 and store the data in local memory 282 (e.g., after the preemption is complete and the original instructions are to execute). Accordingly, stream out unit 290 provides a specialized way for GPU 280 to output intermediate data (e.g., data generated by the geometry pipeline) to system memory 270 and to retrieve this intermediate data from system memory 270.

Although only a single picture processing unit 296 is shown that accesses (e.g., stores and retrieves) data of local memory 282, it should be understood that in other examples, GPU 280 may include or interact with one or more additional picture processing units similar to picture processing unit 296. For example, a picture processing unit that performs the techniques of this disclosure may be provided within stream out unit 290 that accesses (e.g., stores and/or retrieves) image data of system memory 270. Alternatively, this picture processing unit may be positioned between GPU 280 and system memory 270. Additionally or alternatively, a picture processing unit may be included within stream out unit 290, or separate from GPU 280, that receives a rendered image from output merge unit 310 to be displayed (e.g., as part of a display buffer of a device including GPU 280).

Figure 7:
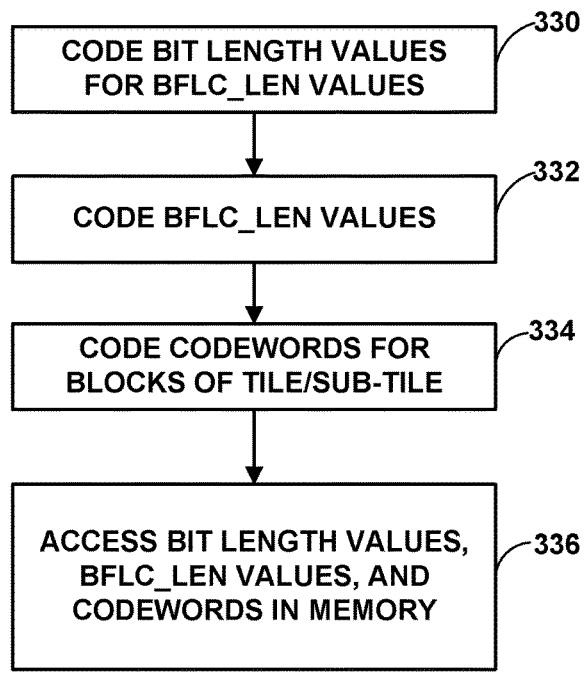
FIG. 7 is a flowchart illustrating an example method of coding a tile or sub-tile of image data in accordance with the techniques of this disclosure.

FIG. 7 is a flowchart illustrating an example method of coding a tile or sub-tile of image data in accordance with the techniques of this disclosure. In general, the method of FIG. 7 represents coding in terms of both encoding and decoding. The method of FIG. 7 is explained with respect to the example of image processing unit 110 of FIG. 1. However, it should be understood that the other various image processing units of this disclosure (such as image processing units 206 and 216 of FIG. 4, picture processing unit 266 of FIG. 5, and picture processing unit 296 of FIG. 6), and other similar units, may be similarly configured to perform this or a similar method.

Initially, image processing unit 110 may code bit length values for block fixed length coding length (bflc_len) values of a tile or sub-tile of an image (330). The bit length values represent numbers of bits needed to represent the bflc_len values themselves. That is, the bit length values represent numbers of bits used to code the bflc_len values, while the bflc_len values represent numbers of bits used to code codewords representing residual values for pixels of the tile or sub-tile corresponding to the respective blocks.

Image processing unit 110 then codes the bflc_len values themselves (332). In particular, image processing unit 110 codes the bflc_len values such that each of the bflc_len values has the number of bits indicated by the corresponding bit length values as discussed above with respect to step 330.

Image processing unit 110 then codes the codewords representing the residual values of the blocks of the tile or sub-tile of the image (334). In particular, image processing unit 110 codes the codewords such that the codewords have the numbers of bits indicated by the respective bflc_len values for the blocks to which the codewords correspond.

Image processing unit 110 further accesses the bit length values, bflc_len values, and codewords in memory 102 (FIG. 1) (336). For example, when coding (per the steps above) includes encoding, image processing unit 110 may store the encoded values (i.e., the bit length values, bflc_len values, and codewords) to memory 102. As another example, when coding includes decoding, image processing unit 110 may retrieve encoded values (i.e., the bit length values, bflc_len values, and codewords) from memory 102. In general, image processing unit 110 may access the bit length values and the bflc_len values in bflc_len data 104 of memory 102, and the codewords in codeword data 106.

In this manner, the method of FIG. 7 represents an example of a method of accessing image data, including coding, by one or more processors of a device, the one or more processors implemented in circuitry, a plurality of bit length values for a plurality of block fixed length code length (bflc_len) values for a plurality of blocks of a tile or sub-tile of an image, the bit length values representing numbers of bits used to code the blfc_len values, and the bflc_len values representing numbers of bits used to code codewords representing residual values for pixels of the tile or sub-tile corresponding to the respective blocks, coding, by the one or more processors, the bflc_len values for each of the plurality of blocks such that the bflc_len values have the numbers of bits indicated by the respective bit length values, coding, by the one or more processors, the codewords for each of the plurality of blocks such that the codewords have the numbers of bits indicated by the bflc_len values for corresponding blocks of the plurality of blocks, and accessing, by the one or more processors, the bit length values, the bflc_len values, and the codewords in a memory of the device.

Figure 8:
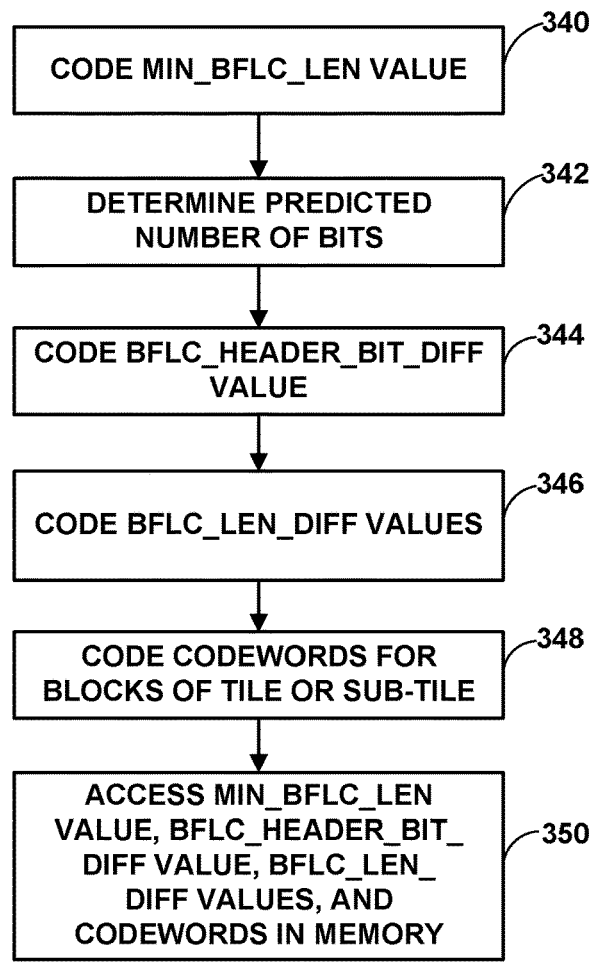
FIG. 8 is a flowchart illustrating an example method of coding a tile or sub-tile of image data in accordance with the techniques of this disclosure.

FIG. 8 is a flowchart illustrating an example method of coding a tile or sub-tile of image data in accordance with the techniques of this disclosure. In general, the method of FIG. 8 represents coding in terms of both encoding and decoding. The method of FIG. 8 is explained with respect to the example of image processing unit 110 of FIG. 1. However, it should be understood that the other various image processing units of this disclosure (such as image processing units 206 and 216 of FIG. 4, picture processing unit 266 of FIG. 5, and picture processing unit 296 of FIG. 6), and other similar units, may be similarly configured to perform this or a similar method. Certain steps of the method of FIG. 8 may generally correspond to step 330 of the method of FIG. 7.

In this example, image processing unit 110 initially codes a min_bflc_len value (340). As noted above, the min_bflc_len value represents a minimum value of a plurality of block fixed length code length (bflc_len) values for a plurality of blocks of a tile or sub-tile of an image. The bflc_len values represent numbers of bits used to code codewords representing residual values for pixels of the tile or sub-tile.

Image processing unit 110 also determines a predicted number of bits (342) to be used to represent differences between the bflc_len values for the plurality of blocks of the tile or sub-tile and the minimum value, min_bflc_len. In particular, image processing unit 110 may determine this predicted number of bits using Table 1 and a bit depth for the image. For example, if the bit depth is 1 or 2, image processing unit 110 may determine a predicted number of bits (n) of 1; if the bit depth is 3 or 4, image processing unit 110 may determine a predicted number of bits (n) of 2; if the bit depth is 5 to 9, image processing unit 110 may determine a predicted number of bits (n) of 3; if the bit depth is 10 to 16, image processing unit 110 may determine a predicted number of bits (n) of 4; and if the bit depth is 17 to 32, image processing unit 110 may determine a predicted number of bits (n) of 5.

Image processing unit 110 may then code a bflc_header_bit_diff value (344). As noted above, the bflc_header_bit_diff value is a difference value that represents a difference between the predicted number of bits and an actual number of bits needed to represent the differences between the bflc_len values for the plurality of blocks of the tile or sub-tile and the minimum value.

Image processing unit 110 may then code bflc_len_diff values (346). As noted above, the bflc_len_diff values represent differences between the bflc_len values for the plurality of blocks of the tile or sub-tile and the minimum value using codewords. In particular, image processing unit 110 may code the bflc_len_diff values such that the bflc_len_diff values have numbers of bits equal to the difference between the predicted number of bits and bflc_header_bit_diff.

Furthermore, image processing unit 110 may code codewords for the blocks of the tile or sub-tile (348). That is, image processing unit 110 may code the codewords for blocks of index values representing residual values of the tile or sub-tile. In particular, image processing unit 110 may code the codewords such that the codewords have numbers of bits indicated by the bflc_len values for corresponding blocks of the plurality of blocks.

Image processing unit 110 may also access the min_bflc_len value, the bflc_header_bit_diff value, the bflc_len_diff values, and the codewords in memory 102 (350). The term "access" may refer to storage or retrieval. In the example of FIG. 8, access is shown as the last step as an indication of storage of image data. However, in other examples, the access may be performed as a first step, e.g., to then decode the data discussed above.

In this manner, the method of FIG. 8 represents an example of a method of accessing image data, including coding, by one or more processors of a device, the one or more processors implemented in circuitry, a plurality of bit length values for a plurality of block fixed length code length (bflc_len) values for a plurality of blocks of a tile or sub-tile of an image, the bit length values representing numbers of bits used to code the blfc_len values, and the bflc_len values representing numbers of bits used to code codewords representing residual values for pixels of the tile or sub-tile corresponding to the respective blocks, coding, by the one or more processors, the bflc_len values for each of the plurality of blocks such that the bflc_len values have the numbers of bits indicated by the respective bit length values, coding, by the one or more processors, the codewords for each of the plurality of blocks such that the codewords have the numbers of bits indicated by the bflc_len values for corresponding blocks of the plurality of blocks, and accessing, by the one or more processors, the bit length values, the bflc_len values, and the codewords in a memory of the device.

The method of FIG. 8 also represents an example of a method of storing image data, the method comprising coding, by one or more processors of a device, the one or more processors implemented in circuitry, a minimum value of a plurality of block fixed length code length (bflc_len) values for a plurality of blocks of a tile or sub-tile of an image, the bflc_len values representing numbers of bits used to code codewords representing residual values for pixels of the tile or sub-tile, determining, by the one or more processors, a predicted number of bits to be used to represent differences between the bflc_len values for the plurality of blocks of the tile or sub-tile and the minimum value, coding, by the one or more processors, a difference value representing a difference between the predicted number of bits and an actual number of bits needed to represent the differences between the bflc_len values for the plurality of blocks of the tile or sub-tile and the minimum value, coding, by the one or more processors, the differences between the bflc_len values for the plurality of blocks of the tile or sub-tile and the minimum value using codewords having numbers of bits equal to the difference between the predicted number of bits and the difference value, coding, by the one or more processors, the codewords for each of the plurality of blocks such that the codewords have numbers of bits indicated by the bflc_len values for corresponding blocks of the plurality of blocks, and accessing, by the one or more processors, the minimum value, the difference value representing the difference between the predicted number of bits and the actual number of bits, the differences between the bflc_len values and the minimum value, and the codewords in a memory of the device.

Figure 9:
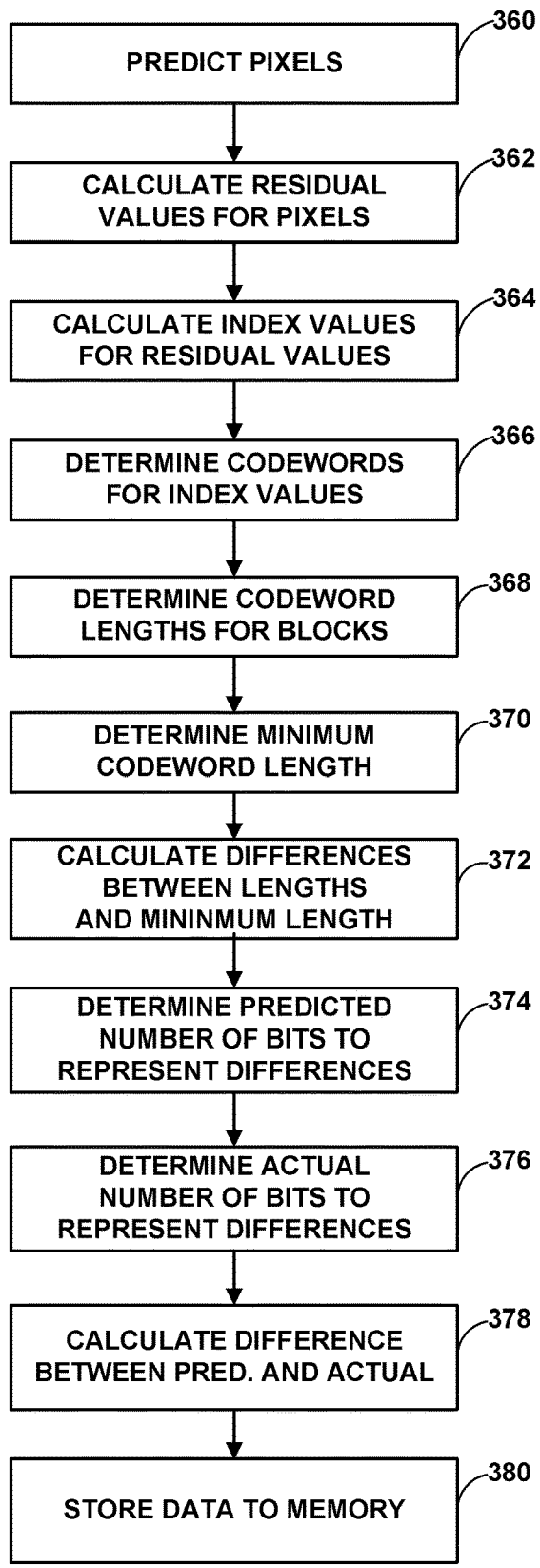
FIG. 9 is a flowchart illustrating an example method of encoding a tile or sub-tile of image data in accordance with the techniques of this disclosure.

FIG. 9 is a flowchart illustrating an example method for encoding a tile or sub-tile of image data in accordance with the techniques of this disclosure. The method of FIG. 9 is explained with respect to the example of image processing unit 110 of FIG. 1. However, it should be understood that the other various image processing units of this disclosure (such as image processing units 206 and 216 of FIG. 4, picture processing unit 266 of FIG. 5, and picture processing unit 296 of FIG. 6), and other similar units, may be similarly configured to perform this or a similar method.

It is assumed that image processing unit 110 initially partitions a received image into tiles or sub-tiles. Image processing unit 110 may perform the method of FIG. 9 on each tile or sub-tile of the image. In particular, image processing unit 110 first predicts pixels of a current tile or sub-tile of the image (360). For example, image processing unit 110 may predict pixels as a sum of a left-neighboring pixel value and an above-neighboring pixel value minus an above-left-neighboring pixel value. Image processing unit 110 may then calculate residual values for each of the pixels (362) as the difference between the actual pixel value and the predicted pixel value.

Image processing unit 110 may then calculate index values for the residual values (364). For example, image processing unit 110 may calculate an index value according to the formula "index value=(|e|<<1)−s," wherein e represents a residual value, "<<" represents the bitwise left-shift operator, s=1 when e is a negative value (e<0), and s=0 when e is a positive value (e≥0).

Image processing unit 110 may then determine codewords for the index values (366). Image processing unit 110 may also determine codeword lengths for blocks of the index values (368). In particular, image processing unit 110 may determine a length of a codeword needed to represent a largest codeword of a block of index values as the length of the codewords for each of the index values in the block, and represent the index values of the block using codewords having that length. As discussed above, "bflc_len" represents the length of the codewords for a block of index values.

After determining codeword lengths for each block of the tile or sub-tile, image processing unit 110 may determine a minimum codeword length (370), that is, a minimum value of all of the bflc_len values for the tile or sub-tile. This minimum value may be referred to as "min_bflc_len."

Image processing unit 110 may then calculate differences between the codeword length values (bflc_len) and the minimum length value (min_bflc_len) for each of the blocks (372). These difference values may be referred to as "bflc_len_diff" values.

Image processing unit 110 may also determine a predicted number of bits needed to represent the differences between the bflc_len values and the min_bflc_len value (374), e.g., according to Table 1 above. For example, if the bit depth is 1 or 2, image processing unit 110 may determine a predicted number of bits (n) of 1; if the bit depth is 3 or 4, image processing unit 110 may determine a predicted number of bits (n) of 2; if the bit depth is 5 to 9, image processing unit 110 may determine a predicted number of bits (n) of 3; if the bit depth is 10 to 16, image processing unit 110 may determine a predicted number of bits (n) of 4; and if the bit depth is 17 to 32, image processing unit 110 may determine a predicted number of bits (n) of 5.

Image processing unit 110 may also determine an actual number of bits needed to represent the differences between the bflc_len values and the min_bflc_len value (376). That is, image processing unit 110 may determine a largest difference between the bflc_len values and the min_bflc_len value, and determine a number of bits needed to represent this largest difference as the actual number of bits needed.

Image processing unit 110 may then calculate a difference between the predicted number of bits and the actual number of bits needed to represent the differences between the bflc_len values and the min_bflc_len value (378). This difference may be referred to as "bflc_header_bit_diff."

Image processing unit 110 may then store data to memory 102 (380), where the data may include the bflc_header_bit_diff value, the min_bflc_len value, the bflc_len_diff values, and the codewords. Each of the bflc_len_diff values as stored may have a number of bits equal to the predicted number of bits minus the bflc_header_bit_diff value. Each of the codewords as stored for a block of index values may have a number of bits equal to the bflc_len_diff value for the block plus the min_bflc_len value.

In this manner, the method of FIG. 9 represents an example of a method of accessing image data, in particular, where accessing includes storing the image data. In this example, the method includes encoding, by one or more processors of a device, the one or more processors implemented in circuitry, a plurality of bit length values for a plurality of block fixed length code length (bflc_len) values for a plurality of blocks of a tile or sub-tile of an image, the bit length values representing numbers of bits used to code the bflc_len values, and the bflc_len values representing numbers of bits used to code codewords representing residual values for pixels of the tile or sub-tile corresponding to the respective blocks, encoding, by the one or more processors, the bflc_len values for each of the plurality of blocks such that the bflc_len values have the numbers of bits indicated by the respective bit length values, encoding, by the one or more processors, the codewords for each of the plurality of blocks such that the codewords have the numbers of bits indicated by the bflc_len values for corresponding blocks of the plurality of blocks, and accessing (storing), by the one or more processors, the bit length values, the bflc_len values, and the codewords in a memory of the device.

The method of FIG. 9 also represents an example of a method of storing image data, the method comprising encoding, by one or more processors of a device, the one or more processors implemented in circuitry, a minimum value of a plurality of block fixed length code length (bflc_len) values for a plurality of blocks of a tile or sub-tile of an image, the bflc_len values representing numbers of bits used to code codewords representing residual values for pixels of the tile or sub-tile, determining, by the one or more processors, a predicted number of bits to be used to represent differences between the bflc_len values for the plurality of blocks of the tile or sub-tile and the minimum value, encoding, by the one or more processors, a difference value representing a difference between the predicted number of bits and an actual number of bits needed to represent the differences between the bflc_len values for the plurality of blocks of the tile or sub-tile and the minimum value, encoding, by the one or more processors, the differences between the bflc_len values for the plurality of blocks of the tile or sub-tile and the minimum value using codewords having numbers of bits equal to the difference between the predicted number of bits and the difference value, encoding, by the one or more processors, the codewords for each of the plurality of blocks such that the codewords have numbers of bits indicated by the bflc_len values for corresponding blocks of the plurality of blocks, and accessing (storing), by the one or more processors, the minimum value, the difference value representing the difference between the predicted number of bits and the actual number of bits, the differences between the bflc_len values and the minimum value, and the codewords in a memory of the device.

Figure 10:
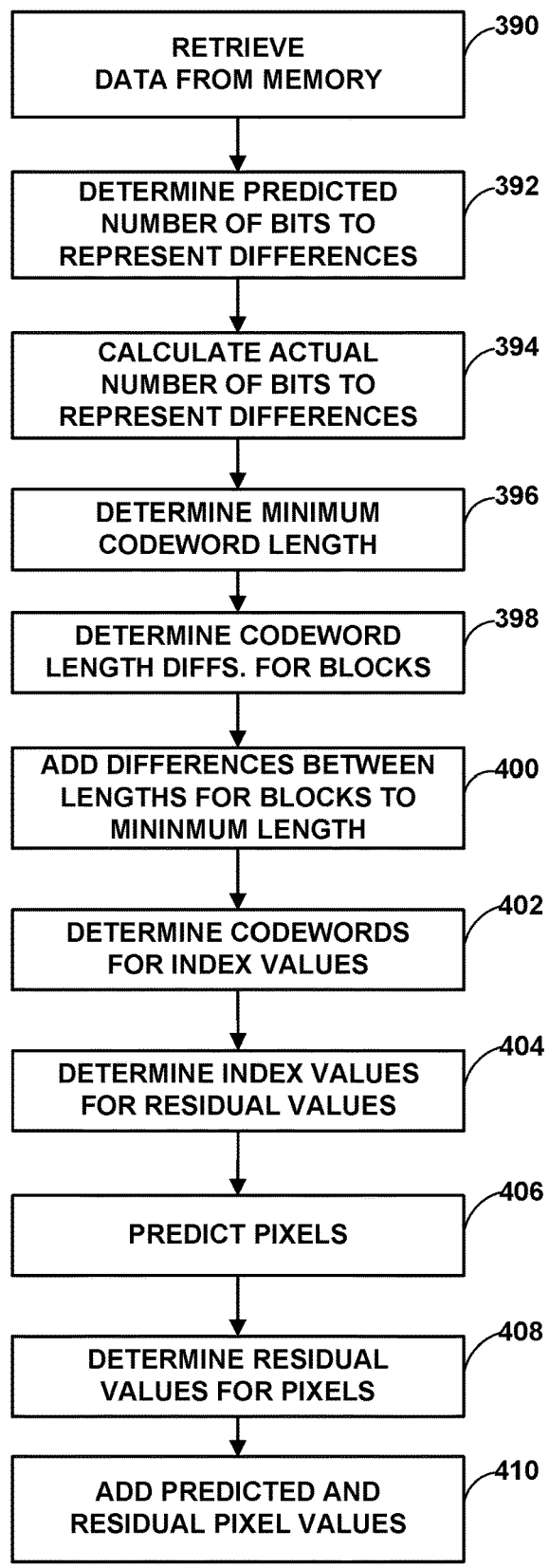
FIG. 10 is a flowchart illustrating an example method of decoding a tile or sub-tile of image data in accordance with the techniques of this disclosure.

FIG. 10 is a flowchart illustrating an example method for decoding a tile or sub-tile of image data in accordance with the techniques of this disclosure. The method of FIG. 10 is explained with respect to the example of image processing unit 110 of FIG. 1. However, it should be understood that the other various image processing units of this disclosure (such as image processing units 206 and 216 of FIG. 4, picture processing unit 266 of FIG. 5, and picture processing unit 296 of FIG. 6), and other similar units, may be similarly configured to perform this or a similar method.

Initially, image processing unit 110 retrieves data from memory 102 (390) for a tile or sub-tile of an image. The retrieved data may include, e.g., a bflc_header_bit_diff value and a min_bflc_len value. Image processing unit 110 also determines a predicted number of bits to represent bflc_len_diff values for blocks of the tile or sub-tile (392). As noted above, the bflc_len_diff values represent differences between bflc_len values for the blocks and the min_bflc_len value. Image processing unit 110 may determine the predicted number of bits using Table 1 above according to a bit depth for the image. For example, if the bit depth is 1 or 2, image processing unit 110 may determine a predicted number of bits (n) of 1; if the bit depth is 3 or 4, image processing unit 110 may determine a predicted number of bits (n) of 2; if the bit depth is 5 to 9, image processing unit 110 may determine a predicted number of bits (n) of 3; if the bit depth is 10 to 16, image processing unit 110 may determine a predicted number of bits (n) of 4; and if the bit depth is 17 to 32, image processing unit 110 may determine a predicted number of bits (n) of 5.

Image processing unit 110 may then calculate an actual number of bits to represent the bflc_len_diff values (394). In particular, image processing unit 110 may subtract the bflc_header_bit_diff value from the predicted number of bits to determine the actual number of bits to represent the bflc_len_diff values.

Image processing unit 110 may also determine a minimum codeword length for the tile or sub-tile (396), e.g., from the min_bflc_len value. Image processing unit 110 may also determine the codeword length differences for blocks of the tile or sub-tile (398). Again, the codeword length differences may correspond to bflc_len_diff values. In particular, image processing unit 110 may retrieve numbers of bits from memory 102 equal to the actual number of bits discussed above for each of the bflc_len_diff values, such that the bflc_len_diff values has the determined actual number of bits. Image processing unit 110 may then add each of the bflc_len_diff values to the min_bflc_len value to determine bflc_len values for each of the blocks of the tile or sub-tile (400).

Image processing unit 110 may then determine codewords for index values of the tile or sub-tile (402). That is, image processing unit 110 may retrieve numbers of bits for codewords of a block of index values equal to the bflc_len value for the block of index values, and do this retrieval for each of the blocks of the tile or sub-tile.

Image processing unit 110 may then determine index values for residual values of pixels of each block of index values (404). That is, image processing unit 110 may recover index values from the codewords.

Image processing unit 110 may also predict pixel values for each of the pixels of the tile or sub-tile (406). For example, for an ordinal first pixel, image processing unit 110 may determine a predicted value of 0. Image processing unit 110 may predict other pixels in a top-row of the tile or sub-tile from left-neighboring pixels, and pixels along a left-edge of the tile or sub-tile from above-neighboring pixels. Image processing unit 110 may predict other pixels as a combination of above-, left-, and/or above-left-neighboring pixels, e.g., the sum of the values of the above-neighboring and left-neighboring pixels minus the above-left-neighboring pixel.

Image processing unit 110 may also determine residual values from the index values for the pixels (408). For example, image processing unit 110 may determine whether a least significant bit of an index value is a 1 or a 0. If the least significant bit is a 1, image processing unit 110 may determine that the residual value is negative, and may add 1 to the index value (i.e., increment the index value) and right-shift the incremented index value by one bit to produce the residual value and set the index value as negative. If the least significant bit is a 0, image processing unit 110 may simply right-shift the index value by one bit to produce the residual value (which is positive, in this case).

Image processing unit 110 may add the predicted values to the residual values for each of the pixels (410) to reproduce (i.e., decode) the current tile or sub-tile. Although not shown in this example, image processing unit 110 may further combine a plurality of tiles or sub-tiles decoded in this manner to reproduce (i.e., decode) a full image.

In this manner, the method of FIG. 10 represents an example of a method of accessing image data, and in particular, retrieving image data. In this example, the method includes decoding, by one or more processors of a device, the one or more processors implemented in circuitry, a plurality of bit length values for a plurality of block fixed length code length (bflc_len) values for a plurality of blocks of a tile or sub-tile of an image, the bit length values representing numbers of bits used to code the blfc_len values, and the bflc_len values representing numbers of bits used to code codewords representing residual values for pixels of the tile or sub-tile corresponding to the respective blocks, decoding, by the one or more processors, the bflc_len values for each of the plurality of blocks such that the bflc_len values have the numbers of bits indicated by the respective bit length values, decoding, by the one or more processors, the codewords for each of the plurality of blocks such that the codewords have the numbers of bits indicated by the bflc_len values for corresponding blocks of the plurality of blocks, and accessing (retrieving), by the one or more processors, the bit length values, the bflc_len values, and the codewords in a memory of the device.

The method of FIG. 10 also represents an example of a method of retrieving image data, the method comprising decoding, by one or more processors of a device, the one or more processors implemented in circuitry, a minimum value of a plurality of block fixed length code length (bflc_len) values for a plurality of blocks of a tile or sub-tile of an image, the bflc_len values representing numbers of bits used to code codewords representing residual values for pixels of the tile or sub-tile, determining, by the one or more processors, a predicted number of bits to be used to represent differences between the bflc_len values for the plurality of blocks of the tile or sub-tile and the minimum value, decoding, by the one or more processors, a difference value representing a difference between the predicted number of bits and an actual number of bits needed to represent the differences between the bflc_len values for the plurality of blocks of the tile or sub-tile and the minimum value, decoding, by the one or more processors, the differences between the bflc_len values for the plurality of blocks of the tile or sub-tile and the minimum value using codewords having numbers of bits equal to the difference between the predicted number of bits and the difference value, decoding, by the one or more processors, the codewords for each of the plurality of blocks such that the codewords have numbers of bits indicated by the bflc_len values for corresponding blocks of the plurality of blocks, and accessing (retrieving), by the one or more processors, the minimum value, the difference value representing the difference between the predicted number of bits and the actual number of bits, the differences between the bflc_len values and the minimum value, and the codewords in a memory of the device.

In one or more examples, the functions described may be implemented in hardware, software, firmware, or any combination thereof. If implemented in software, the functions may be stored on or transmitted over as one or more instructions or code on a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code, and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transitory media, but are instead directed to non-transitory, tangible storage media. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a codec hardware unit or provided by a collection of interoperative hardware units, including one or more processors as described above, in conjunction with suitable software and/or firmware.

Various examples have been described. These and other examples are within the scope of the following claims.

What is claimed is:

1. A method of accessing media data, the method comprising:
   coding, by one or more processors of a device, the one or more processors implemented in circuitry, a plurality of bit length values for a plurality of block fixed length code length (bflc_len) values for a plurality of blocks of a tile or sub-tile of an image, the bit length values representing numbers of bits used to code the bflc_len values, and the bflc_len values representing numbers of bits used to code codewords representing residual values for pixels of the tile or sub-tile corresponding to the respective blocks;
   coding, by the one or more processors, the bflc_len values for each of the plurality of blocks such that the bflc_len n values have the numbers of bits indicated by the respective bit length values, wherein at least two of the bflc_len values have different number of bits;
   coding, by the one or more processors, the codewords for each of the plurality of blocks such that the codewords have the numbers of bits indicated by the values for corresponding blocks of the plurality of blocks; and
   accessing, by the one or more processors, the bit length values, the bflc_len values, and the codewords in a memory of the device.

2. The method of claim 1, wherein coding the bit length values comprises:
   coding a minimum value of the bflc_len values for the plurality of blocks;

determining a predicted number of bits to be used to represent differences between the bflc_len values for the plurality of blocks of the tile or sub-tile and the minimum value;

coding a difference value representing a difference between the predicted number of bits and an actual number of bits needed to represent the differences between the bflc_len values for the plurality of blocks of the tile or sub-tile and the minimum value; and coding, by the one or more processors, the differences between the bflc_len values for the plurality of blocks of the tile or sub-tile and the minimum value using codewords having numbers of bits equal to the difference between the predicted number of bits and the difference value, and wherein accessing the plurality of bit length values comprises accessing the minimum value, the difference value representing the difference between the predicted number of bits and the actual number of bits, and the differences between the bflc_len values and the minimum value.

3. The method of claim 2, wherein the minimum value comprises a min_bflc_len value, wherein the difference value representing the difference between the predicted number of bits and the actual number of bits comprises a bflc_header_bit_diff value, and wherein the differences between the bflc_len values and the minimum value comprise bflc_len_diff values.

4. The method of claim 1, wherein coding the bit length values comprises encoding the bit length values, wherein coding the bflc_len values comprises encoding the bflc_len values, wherein coding the codewords comprises encoding the codewords, and wherein accessing the bit length values, the bflc_len values, and the codewords comprises storing the bit length values, the bflc_len values, and the codewords to the memory.

5. The method of claim 4, further comprising:
predicting values for the pixels using neighboring pixels to the pixels; and
calculating the residual values as differences between the predicted values and actual values for the pixels.

6. The method of claim 4, wherein the codewords represent index values representing the residual values, the method further comprising calculating the index values from the residual values using the formula "index value=(|e|<<1)−s," wherein e represents a residual value, "<<" represents the bitwise left-shift operator, s=1 when e is a negative value, and s=0 when e is a positive value.

7. The method of claim 1, wherein coding the bit length values comprises decoding the bit length values, wherein coding the bflc_len values comprises decoding the bflc_len values, wherein coding the codewords comprises decoding the codewords, and wherein accessing the bit length values, the bflc_len values, and the codewords comprises retrieving the bit length values, the bflc_len values, and the codewords from the memory.

8. The method of claim 7, further comprising:
determining the residual values from the codeword values;
predicting values for the pixels using neighboring pixels to the pixels; and
adding the predicted values to the residual values to decode values for the pixels.

9. A device for accessing media data, the device comprising:
a memory configured to store media data; and
one or more processors implemented in circuitry and configured to:
code a plurality of bit length values for a plurality of block fixed length code length (bflc_len) values for a plurality of blocks of a tile or sub-tile of an image, the bit length values representing numbers of bits used to code the bflc_len values, and the bflc_len values representing numbers of bits used to code codewords representing residual values for pixels of the tile or sub-tile corresponding to the respective blocks;
code the bflc_len values for each of the plurality of blocks such that the bflc_len values have the numbers of bits indicated by the respective bit length values, wherein at least two of the bflc_len values have different number of bits;
code the codewords for each of the plurality of blocks such that the codewords have the numbers of bits indicated by the bflc_len values for corresponding blocks of the plurality of blocks; and
access the bit length values, the bflc_len values, and the codewords in the memory.

10. The device of claim 9, wherein to code the plurality of bit length values, the one or more processors are configured to:
code a minimum value of the bflc_len values for the plurality of blocks;
determine a predicted number of bits to be used to represent differences between the bflc_len values for the plurality of blocks of the tile or sub-tile and the minimum value;
code a difference value representing a difference between the predicted number of bits and an actual number of bits needed to represent the differences between the bflc_len values for the plurality of blocks of the tile or sub-tile and the minimum value; and
code the differences between the bflc_len values for the plurality of blocks of the tile or sub-tile and the minimum value using codewords having numbers of bits equal to the difference between the predicted number of bits and the difference value, and
wherein to access the bit length values in the memory, the one or more processors are configured to access the minimum value, the difference value representing the difference between the predicted number of bits and the actual number of bits, and the differences between the bflc_len values and the minimum value in the memory.

11. The device of claim 10, wherein the minimum value comprises a min_bflc_len value, wherein the difference value representing the difference between the predicted number of bits and the actual number of bits comprises a bflc_header_bit_diff value, and wherein the differences between the bflc_len values and the minimum value comprise bflc_len_diff values.

12. The device of claim 9, wherein to code the bit length values, the bflc_len values, and the codewords, the one or more processors are configured to encode the bit length values, the bflc_len values, and the codewords, and wherein to access the bit length values, the bflc_len values, and the codewords, the one or more processors are configured to store the bit length values, the bflc_len values, and the codewords to the memory.

13. The device of claim 12, wherein the one or more processors are further configured to:
predict values for the pixels using neighboring pixels to the pixels; and
calculate the residual values as differences between the predicted values and actual values for the pixels.

14. The device of claim 12, wherein the codewords represent index values representing the residual values, and wherein the one or more processors are further configured to calculate the index values from the residual values using the formula "index value=(|e|<<1)−s," wherein e represents a residual value, "<<" represents the bitwise left-shift operator, s=1 when e is a negative value, and s=0 when e is a positive value.

15. The device of claim 9, wherein to code the bit length values, the bflc_len values, and the codewords, the one or more processors are configured to decode the bit length values, the bflc_len values, and the codewords, and wherein to access the bit length values, the bflc_len values, and the codewords, the one or more processors are configured to retrieve the bit length values, the bflc_len values, and the codewords from the memory.

16. The device of claim 15, wherein the one or more processors are further configured to:
determine the residual values from the codeword values;
predict values for the pixels using neighboring pixels to the pixels; and
add the predicted values to the residual values to decode values for the pixels.

17. A non-transitory computer-readable storage medium comprising instructions that, when executed, cause a processor of a device to:
code a plurality of bit length values for a plurality of block fixed length code length (bflc_len) values for a plurality of blocks of a tile or sub-tile of an image, the bit length values representing numbers of bits used to code the bflc_len values, and the bflc_len values representing numbers of bits used to code codewords representing residual values for pixels of the tile or sub-tile corresponding to the respective blocks;
code the bflc_len values for each of the plurality of blocks such that the bflc_len values have the numbers of bits indicated by the respective bit length values, wherein at least two of the bflc_len values have different number of bits;
code the codewords for each of the plurality of blocks such that the codewords have the numbers of bits indicated by the bflc_len values for corresponding blocks of the plurality of blocks; and
access the bit length values, the values, and the codewords in a memory of the device.

18. The non-transitory computer-readable storage medium of claim 17, wherein the instructions that cause the processor to code the plurality of bit length values comprise instructions that cause the processor to:
code a minimum value of the bflc_len values for the plurality of blocks;
determine a predicted number of bits to be used to represent differences between the values for the plurality of blocks of the tile or sub-tile and the minimum value;
code a difference value representing a difference between the predicted number of bits and an actual number of bits needed to represent the differences between the bflc_len values for the plurality of blocks of the tile or sub-tile and the minimum value; and
code the differences between the bflc_len values for the plurality of blocks of the tile or sub-tile and the minimum value using codewords having numbers of bits equal to the difference between the predicted number of bits and the difference value, and
wherein the instructions that cause the processor to access the bit length values comprise instructions that cause the processor to access the minimum value, the difference value representing the difference between the predicted number of bits and the actual number of bits, and the differences between the bflc_len values and the minimum value in the memory.

19. The non-transitory computer-readable storage medium of claim 17, wherein the instructions that cause the processor to code the bit length values, the btlc_len values, and the codewords comprise instructions that cause the processor to encode the bit length values, the bflc_len values, and the codewords, and wherein the instructions that cause the processor to access the bit length values, the bflc_len values, and the codewords comprise instructions that cause the processor to store the bit length values, the bflc_len values, and the codewords to the memory.

20. The non-transitory computer-readable storage medium of claim 19, further comprising instructions that cause the processor to:
predict values for the pixels using neighboring pixels to the pixels; and calculate the residual values as differences between the predicted values and actual values for the pixels.

21. The non-transitory computer-readable storage medium of claim 19, wherein the codewords represent index values representing the residual values, further comprising instructions that cause the processor to calculate the index values from the residual values using the formula "index value=(|e|<<1)−s," wherein e represents a residual value, "<<" represents the bitwise left-shift operator, s=1 when e is a negative value, and s=0 when e is a positive value.

22. The non-transitory computer-readable storage medium of claim 17, wherein the instructions that cause the processor to code the bit length values, the bflc_len values, and the codewords comprise instructions that cause the processor to decode the bit length values, the bflc_len values, and the codewords, and wherein the instructions that cause the processor to access the bit length values, the bflc_len values, and the codewords comprise instructions that cause the processor to retrieve the bit length values, the bflc_len values, and the codewords from the memory.

23. The non-transitory computer-readable storage medium of claim 22, further comprising instructions that cause the processor to:
determine the residual values from the codeword values;
predict values for the pixels using neighboring pixels to the pixels; and add the predicted values to the residual values to decode values for the pixels.

24. A device for accessing media data, the device comprising:
a memory configured to store media data;
means for coding a plurality of bit length values for a plurality of block fixed length code length (bflc_len) values for a plurality of blocks of a tile or sub-tile of an image, the bit length values representing numbers of bits used to code the bflc_len values, and the bflc_len values representing numbers of bits used to code codewords representing residual values for pixels of the tile or sub-tile corresponding to the respective blocks;
means for coding the bflc_len values for each of the plurality of blocks such that the values have the numbers of bits indicated by the respective bit length values, wherein at least two of the bflc_len values have different number of bits;
means for coding the codewords for each of the plurality of blocks such that the codewords have the numbers of bits indicated by the bflc_len values for corresponding blocks of the plurality of blocks; and means for accessing the bit length values, the bflc_len values, and the codewords in the memory.

25. The device of claim 24, wherein the means for accessing the bit length values comprises:
   means for coding a minimum value of the plurality of bflc_len values for the plurality of blocks;
   means for determining a predicted number of bits to be used to represent differences between the bflc_len values for the plurality of blocks of the tile or sub-tile and the minimum value;
   means for coding a difference value representing a difference between the predicted number of bits and an actual number of bits needed to represent the differences between the bflc_len values for the plurality of blocks of the tile or sub-tile and the minimum value; and
   means for coding the differences between the bflc_len values for the plurality of blocks of the tile or sub-tile and the minimum value using codewords having numbers of bits equal to the difference between the predicted number of bits and the difference value, and
   wherein the means for accessing the bit length values comprises means for accessing the minimum value, the difference value representing the difference between the predicted number of bits and the actual number of bits, and the differences between the bflc_len values and the minimum value in the memory.

26. The device of claim 24, wherein the means for coding the bit length values comprises means for decoding the bit length values, wherein the means for coding the bflc_len values comprises means for decoding the bflc_len values, wherein the means for coding the codewords comprises means for decoding the codewords, and wherein the means for accessing the bit length values, the bflc_len values, and the codewords comprises means for storing the bit length values, the bflc_len values, and the codewords to the memory.

27. The device of claim 26, further comprising:
   means for predicting values for the pixels using neighboring pixels to the pixels; and
   means for calculating the residual values as differences between the predicted values and actual values for the pixels.

28. The device of claim 26, wherein the codewords represent index values representing the residual values, further comprising means for calculating the index values from the residual values using the formula "index value= $(|e|<<1)-s$," wherein e represents a residual value, "$<<$" represents the bitwise left-shift operator, $s=1$ when e is a negative value, and $s=0$ when e is a positive value.

29. The device of claim 24, wherein the means for coding the bit length values comprises means for decoding the bit length values, wherein the means for coding the bflc_len values comprises means for decoding the bflc_len values, wherein the means for coding the codewords comprises means for decoding the codewords, and wherein the means for accessing the bit length values, the bflc_len values, and the codewords comprises means for retrieving the bit length values, the bflc_len values, and the codewords from the memory.

30. The device of claim 29, further comprising:
   means for determining the residual values from the codeword values;
   means for predicting values for the pixels using neighboring pixels to the pixels; and
   means for adding the predicted values to the residual values to decode values for the pixels.

* * * * *